United States Patent
Kim et al.

(10) Patent No.: US 11,112,997 B2
(45) Date of Patent: Sep. 7, 2021

(54) STORAGE DEVICE AND OPERATING METHOD THEREOF

(71) Applicant: Samsung Electronics Co., Ltd., Suwon-si (KR)

(72) Inventors: Taehyun Kim, Seoul (KR); Chankyung Kim, Hwaseong-si (KR); Sang-won Shim, Seoul (KR); Suk-Soo Pyo, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 98 days.

(21) Appl. No.: 16/394,506

(22) Filed: Apr. 25, 2019

(65) Prior Publication Data
US 2020/0065029 A1 Feb. 27, 2020

(30) Foreign Application Priority Data

Aug. 21, 2018 (KR) .......................... 10-2018-0097281
Dec. 6, 2018 (KR) .......................... 10-2018-0156245

(51) Int. Cl.
*G06F 3/06* (2006.01)
*G06F 11/10* (2006.01)
*G11C 29/52* (2006.01)

(52) U.S. Cl.
CPC .......... *G06F 3/0659* (2013.01); *G06F 3/0604* (2013.01); *G06F 3/064* (2013.01); *G06F 3/0647* (2013.01); *G06F 3/0652* (2013.01); *G06F 3/0679* (2013.01); *G06F 11/1068* (2013.01); *G11C 29/52* (2013.01)

(58) Field of Classification Search
CPC .... G06F 3/0659; G06F 3/0604; G06F 3/0679; G06F 3/0652; G06F 3/0647; G06F 11/1068; G06F 3/064; G11C 29/52
See application file for complete search history.

(56) References Cited

U.S. PATENT DOCUMENTS

| 8,745,319 | B2 | 6/2014 | Langlois et al. |
| 9,910,602 | B2 | 3/2018 | Yoshida et al. |
| 2010/0306446 | A1* | 12/2010 | Villa ........................ G11C 5/14 711/102 |

(Continued)

OTHER PUBLICATIONS

Hoberman, Barry "11 Myths About MRAM" [online] Published Jan. 18, 2017 <Retrieved on Nov. 19, 2020> Retrieved from the Internet <URL: https://www.electronicdesign.com/technologies/memory/article/21802179/11-myths-about-mram> (Year: 2017).*

*Primary Examiner* — David Yi
*Assistant Examiner* — Dustin B. Fulford
(74) *Attorney, Agent, or Firm* — Harness, Dickey & Pierce, P.L.C.

(57) ABSTRACT

An operating method of a storage device which includes a first nonvolatile memory device and a second nonvolatile memory device includes detecting sudden power-off, suspending an operation being performed in the first nonvolatile memory device, in response to the detected sudden power-off, writing suspension information about the suspended operation into the second nonvolatile memory device, and performing a block management operation on the first nonvolatile memory device based on the suspension information written into the second nonvolatile memory device, in power-up after the sudden power-off.

16 Claims, 23 Drawing Sheets

(56) References Cited

U.S. PATENT DOCUMENTS

| | | |
|---|---|---|
| 2011/0093650 A1 | 4/2011 | Kwon et al. |
| 2011/0208898 A1* | 8/2011 | Shin .................... G06F 12/0246 |
| | | 711/103 |
| 2014/0047161 A1 | 2/2014 | Nemazie |
| 2014/0047164 A1 | 2/2014 | Nemazie |
| 2015/0155050 A1 | 6/2015 | Trantham et al. |
| 2015/0186042 A1* | 7/2015 | Lee ........................ G11C 16/10 |
| | | 711/103 |
| 2017/0052734 A1* | 2/2017 | Kirchner ............... G06F 3/0652 |
| 2017/0060706 A1 | 3/2017 | Kinoshita |
| 2017/0147207 A1 | 5/2017 | Hansson et al. |
| 2017/0185335 A1 | 6/2017 | Pardoe |
| 2017/0220274 A1* | 8/2017 | Park ...................... G06F 3/0655 |

\* cited by examiner

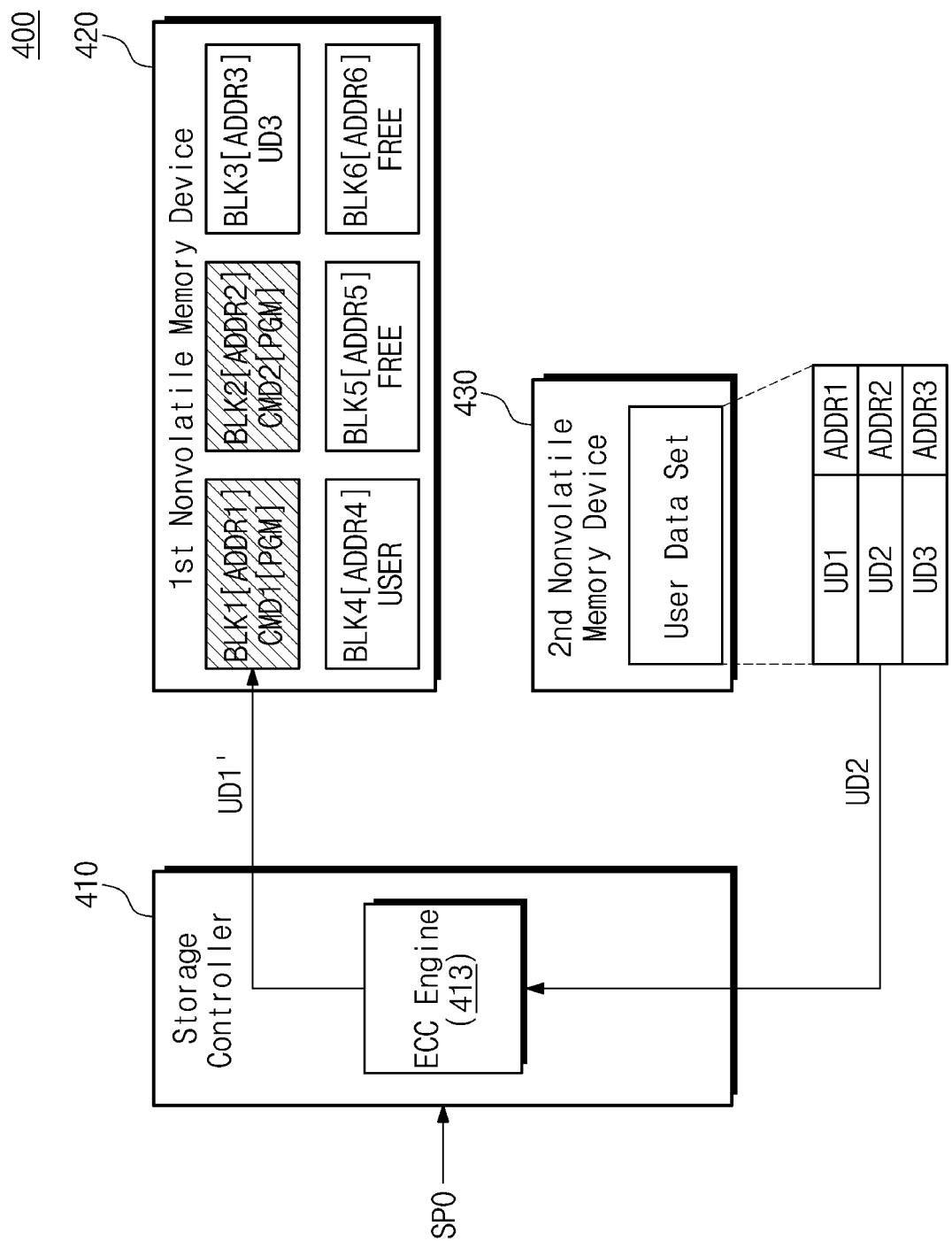

STORAGE DEVICE AND OPERATING METHOD THEREOF

CROSS-REFERENCE TO RELATED APPLICATIONS

This application claims priority under 35 U.S.C. § 119 to Korean Patent Application Nos. 10-2018-0097281 filed on Aug. 21, 2018 and 10-2018-0156245 filed on Dec. 6, 2018, in the Korean Intellectual Property Office, the disclosures of which are incorporated by reference herein in their entireties.

TECHNICAL FIELD

Embodiments of the inventive concepts disclosed herein relate to a semiconductor memory, and more particularly, relate to a storage device and an operating method thereof.

BACKGROUND

A semiconductor memory device is classified as a volatile memory device, in which stored data disappear when a power is turned off, such as a static random access memory (SRAM) or a dynamic random access memory (DRAM), or a nonvolatile memory device, in which stored data are retained even when a power is turned off, such as a flash memory device, a phase-change RAM (PRAM), a magnetic RAM (MRAM), a resistive RAM (RRAM), or a ferroelectric RAM (FRAM).

A high-capacity storage device based on a flash memory operates through external power. In this case, in the case where sudden power-off (SPO) occurs while the storage device operates, the storage device completes an operation (e.g., a program operation or an erase operation) being performed in the storage device by using a separate auxiliary power source such as a super capacitor or a tantal capacitor. However, since a lot of time is taken to complete the operation which the storage device is performing, a high-capacity auxiliary power source is required, thus causing an increase in the area and costs of the storage device.

SUMMARY

Embodiments of the inventive concepts provide a storage device capable of coping with sudden power-off by using a reduced auxiliary power source and an operating method thereof.

According to some example embodiments, an operating method of a storage device which includes a first nonvolatile memory device and a second nonvolatile memory device includes detecting sudden power-off, suspending an operation being performed in the first nonvolatile memory device, in response to the detected sudden power-off, writing suspension information about the suspended operation into the second nonvolatile memory device, and performing a block management operation on the first nonvolatile memory device based on the suspension information written into the second nonvolatile memory device, in power-up after the sudden power-off.

According to some example embodiments, a storage device includes a first nonvolatile memory device that stores user data, a second nonvolatile memory device that stores operation information about an operation of the first nonvolatile memory device, and a storage controller that suspends the operation being performed in the first nonvolatile memory device when sudden power-off occurs, writes a sudden power-off flag in operation information corresponding to the suspended operation among the operation information stored in the second nonvolatile memory device, and performs a block management operation on the first nonvolatile memory device based on the sudden power-off flag written into the second nonvolatile memory device, in power-up after the sudden power-off.

According to some example embodiments, a storage device includes a first nonvolatile memory device, a second nonvolatile memory device that temporarily stores user data to be stored to the first nonvolatile memory device, and a storage controller that suspends an operation being performed in the first nonvolatile memory device in sudden power-off, writes a sudden power-off flag for data not stored in the first nonvolatile memory device among the user data temporarily stored in the second nonvolatile memory device, and performs migration of data not stored in the first nonvolatile memory device from the second nonvolatile memory device to the first nonvolatile memory device based on the sudden power-off flag written into the second nonvolatile memory device, in power-up after the sudden power-off.

BRIEF DESCRIPTION OF THE FIGURES

The above and other objects and features of the inventive concepts will become apparent by describing in detail example embodiments thereof with reference to the accompanying drawings.

FIGS. 14A to 14C are diagrams for describing an operation according to the flowchart of FIG. 13.

DETAILED DESCRIPTION

Below, some example embodiments of the inventive concepts may be described in detail and clearly to such an extent that an ordinary one in the art easily implements the inventive concepts.

Figure 1:
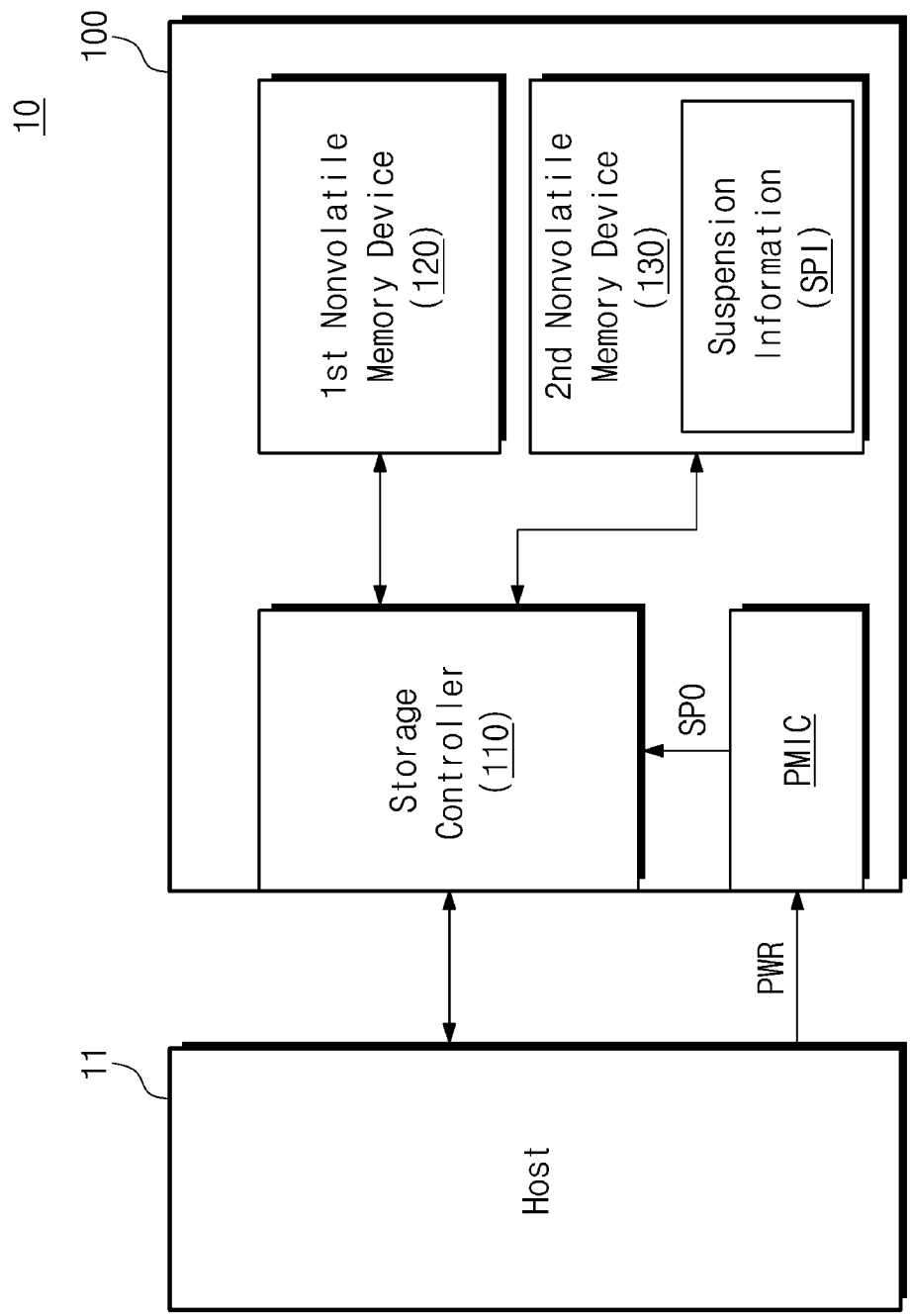
FIG. 1 is a block diagram illustrating a storage system according to some example embodiments of the inventive concepts.

FIG. 1 is a block diagram illustrating a storage system according to some example embodiments of the inventive concepts. Referring to FIG. 1, a storage system 10 may include a host 11 and a storage device 100. The storage system 10 may be a computing system such as a personal computer, a server, a workstation, a notebook, a digital camera, and/or a smartphone. The storage device 100 may be used as a high-capacity storage medium of the storage system 10.

The host 11 may store data to the storage device 100 or may read data stored in the storage device 100. In some example embodiments, the host 11 may supply a power PWR to the storage device 100.

The storage device 100 may include a storage controller 110, a first nonvolatile memory device 120, a second nonvolatile memory device 130, and/or a power management integrated circuit PMIC.

Under control of the host 11, the storage controller 110 may store data to the first nonvolatile memory device 120 or may read data stored in the first nonvolatile memory device 120.

The first nonvolatile memory device 120 may operate under control of the storage controller 110. The second nonvolatile memory device 130 may store a variety of information necessary for the storage controller 110 to operate.

In some example embodiments, the first nonvolatile memory device 120 may be a NAND flash memory device, and the second nonvolatile memory device 130 may be a magnetic random access memory (MRAM). However, the inventive concepts are not limited thereto. For example, the first and second nonvolatile memory devices 120 and 130 may include various nonvolatile memory devices such as a flash memory, an MRAM, a PRAM, a RRAM, and a FRAM. In some example embodiments, the second nonvolatile memory device 130 may have a higher operating speed than the first nonvolatile memory device 120.

The power management integrated circuit PMIC may provide a power necessary for the storage device 100 to operate, based on the power PWR from the host 11. For example, the power management integrated circuit PMIC may supply a power necessary for each of the storage controller 110, the first nonvolatile memory device 120, and the second nonvolatile memory device 130 to operate.

In some example embodiments, the power PWR from the host 11 may be suddenly blocked or turned off. This is called "sudden power-off (SPO)". The power management integrated circuit PMIC may detect the sudden power-off and may transmit a sudden power-off signal (hereinafter referred to as a "SPO signal") to the storage controller 110.

In response to the SPO signal, the storage controller 110 may suspend an operation of the first nonvolatile memory device 120 and may store information about the suspended operation to the second nonvolatile memory device 130 as suspension information SPI. The suspension information SPI may include command information and address information about the operation suspended in the first nonvolatile memory device 120.

After the sudden power-off, in the case where the storage device 100 is powered up (e.g., the supply of power is resumed), the storage controller 110 may perform various block management operations based on the suspension information SPI stored in the second nonvolatile memory device 130. A block management operation which is based on the suspension information SPI after power-up will be more fully described with reference to drawings below.

In some example embodiments, an operation of writing the suspension information SPI into the second nonvolatile memory device 130 may be performed by using a separate auxiliary power source (not illustrated) included in the storage device 100. For example, the storage device 100 may include a separate device (not illustrated) for providing an auxiliary power, such as a super capacitor or a tantal capacitor. In the case where the sudden power-off occurs, the power management integrated circuit PMIC may use the separate device to provide the auxiliary power to the storage controller 110, the first nonvolatile memory device 120, and the second nonvolatile memory device 130. The second nonvolatile memory device 130 may perform a write operation associated with the above suspension information SPI by using the auxiliary power.

In some example embodiments, in the case where the sudden power-off occurs, a conventional storage device completes an operation (e.g., a read operation, a program operation, or an erase operation) being performed in the first nonvolatile memory device 120 by using an auxiliary power. In this case, since an operating speed of the first nonvolatile memory device 120 is slower than an operating speed of the second nonvolatile memory device 130, a lot of time is taken to complete the operation being performed. This causes an increase in a capacity of an auxiliary power source required when the sudden power-off occurs.

In contrast, in the case where the sudden power-off occurs, the storage device 100 according to some example embodiments of the inventive concepts suspends an operation being performed in the first nonvolatile memory device 120 and writes operation information (e.g., the suspension information) about the suspended operation into the second nonvolatile memory device 130. That is, since only a write operation is performed on the second nonvolatile memory device 130 having a relatively high operating speed, the storage device 100 according to some example embodiment of the inventive concepts may cope with the sudden power-off by using a relatively small auxiliary power source compared to the related art.

In some example embodiments, the sudden power-off is described as the case where the power PWR provided from the host 11 is suddenly blocked, but the inventive concepts are not limited thereto. For example, even though the power PWR provided from the host 11 is uniformly maintained, due to various internal issues of the storage device 100, a power which is provided to the storage controller 110, the first nonvolatile memory device 120, or the second nonvolatile memory device 130 may become unstable. In this case, the power management integrated circuit PMIC may determine that a sudden power-off situation occurs with regard to a particular device, and may output the SPO signal.

In some example embodiments, a description is given as the power management integrated circuit PMIC detects the sudden power-off and outputs the SPO signal, but the inventive concepts are not limited thereto. For example, each of the storage controller 110, the first nonvolatile memory device 120, and the second nonvolatile memory device 130 may include a power detector (not illustrated) or a voltage detector (not illustrated). The power detector included in each of the storage controller 110, the first nonvolatile memory device 120, and the second nonvolatile memory device 130 may be configured to detect a sudden power-off situation occurring with regard to a relevant configuration. That is, the power detector included in the storage controller 110 may detect the sudden power-off with regard to a power provided to the storage controller 110. Alternatively, the power detector included in the first nonvolatile memory device 120 may detect the sudden power-off with regard to a power provided to the first nonvolatile memory device 120. Alternatively, the power detector included in the second nonvolatile memory device 130 may detect the sudden power-off with regard to a power provided to the second nonvolatile memory device 130.

That is, the sudden power-off may indicate sudden power-off associated with a power provided to the storage device 100 or may indicate sudden power-off associated with each of the storage controller 110, the first nonvolatile memory device 120, and the second nonvolatile memory device 130. Below, a description will be given as the sudden power-off is sudden power-off associated with the storage device 100; however, as described above, the sudden power-off may indicate sudden power-off associated with each component.

Figure 2:
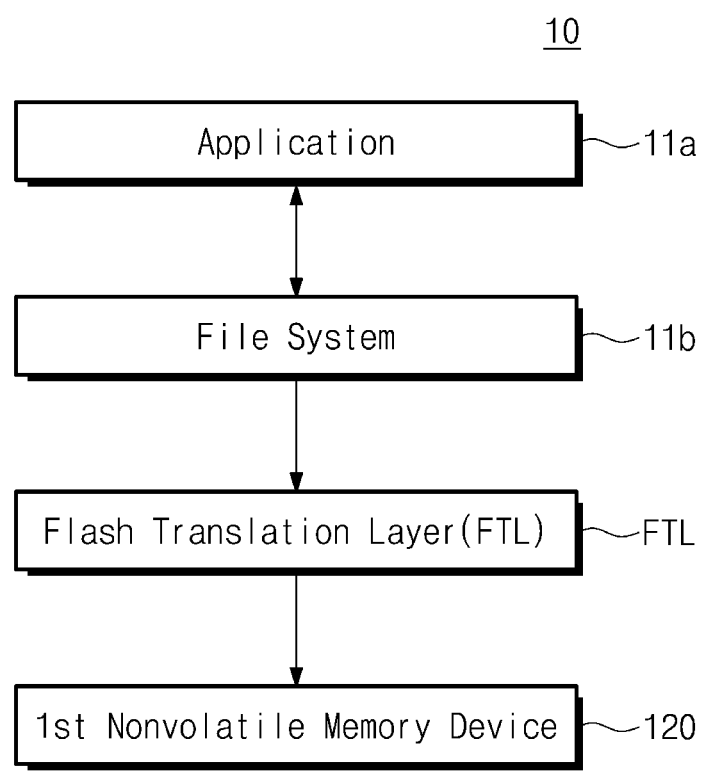
FIG. 2 is a block diagram illustrating software layers of a storage system of FIG. 1.

FIG. 2 is a block diagram illustrating software layers of a storage system of FIG. 1. Referring to FIGS. 1 and 2, software layers of the storage system 10 may include an application 11*a*, a file system 11*b*, and/or a flash translation layer FTL.

The application 11*a* may include various application programs which are driven on the storage system 10 or the host 11. The file system 11*b* may organize files or data which are used by the application 11*a*. For example, the file system 11*b* may manage a storage space of the storage device 100 with logical addresses and may assign a logical address to data stored in or to be stored to the storage device 100 for management.

In some example embodiments, a type of the file system 12*b* may vary with an operating system OS of the storage system 10 or the host 11. In some example embodiments, the file system 11*b* may include FAT (File Allocation Table), FAT32, NTFS (NT File System), HFS (Hierarchical File System), JSF2 (Journaled File System2), XFS, ODS-5 (On-Disk Structure-5), UDF, ZFS, UFS (Unix File System), ext2, ext3, ext4, ReiserFS, Reiser4, ISO 9660, Gnome VFS, BFS, WinFS, or the like. In some example embodiments, the application 11*a* and the file system 11*b* may be software layers which are driven on the host 11.

The flash translation layer FTL may perform various maintenance operations between the host 11 and the first nonvolatile memory device 120 such that the first nonvolatile memory device 120 is used efficiently. For example, the flash translation layer FTL may perform a translation operation between a logical address and a physical address. The logical address is information managed by the file system 11*b*, and the physical address is information indicating a physical location of the first nonvolatile memory device 120, at which data are to be stored. The flash translation layer FTL manages the above-described address translation operation through a mapping table (not illustrated).

In some example embodiments, a block management operation based on the suspension information SPI, which is described with reference to FIG. 1 may be performed by the flash translation layer FTL. For example, the flash translation layer FTL may update or remap the mapping table based on the suspension information SPI, or may adjust garbage collection (GC) priorities of memory blocks of the first nonvolatile memory device 120.

Figure 3:
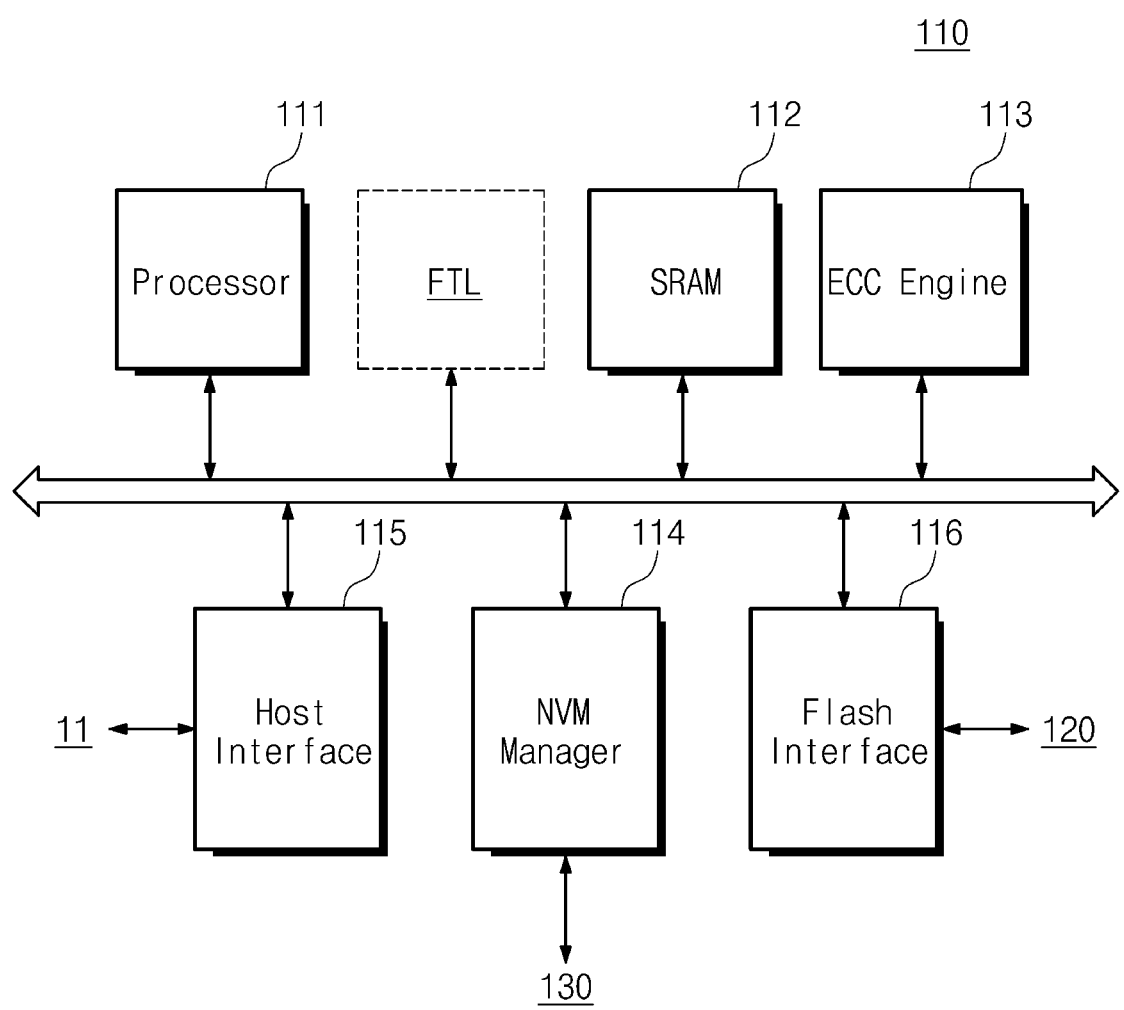
FIG. 3 is a block diagram illustrating a storage controller of FIG. 1.

FIG. 3 is a block diagram illustrating a storage controller 110 of FIG. 1. Referring to FIGS. 1 and 3, the storage controller 110 may include a processor 111, a static RAM (SRAM) 112, an error correction code (ECC) engine 113, a nonvolatile memory manager 114, a host interface 115, and/or a flash interface 116.

The processor 111 may control overall operations of the storage controller 110. The SRAM 112 may be used as a cache memory or a working memory of the storage controller 110. In some example embodiments, the flash translation layer FTL described with reference to FIG. 2 may be provided in the form of software, and a program code, an instruction, etc. associated with the flash translation layer FTL may be stored to the SRAM 112. The flash translation layer FTL stored to the SRAM 112 may be executed by the processor 111.

The ECC engine 113 may be configured to correct an error of various data exchanged through the storage controller 110. For example, the ECC engine 113 may generate an error correction code for data provided from the host 11. Alternatively, the ECC engine 113 may correct an error based on data provided from the first nonvolatile memory device 120 and an error correction code. In some example embodiments, the ECC engine 113 may perform an error correction operation on data stored in the second nonvolatile memory device 130.

The nonvolatile memory manager 114 may be configured to control the second nonvolatile memory device 130. For example, the nonvolatile memory manager 114 may read data stored in the second nonvolatile memory device 130 or may write data into the second nonvolatile memory device 130.

The storage controller 110 may communicate with the host 11 through the host interface 115. The host interface 115 may include at least one of various interfaces such as a double data rate (DDR) interface, a low-power DDR (LPDDR) interface, a universal serial bus (USB) interface, a multimedia card (MMC) interface, a peripheral component interconnection (PCI) interface, a PCI-express (PCI-e) interface, an advanced technology attachment (ATA) interface, a serial-ATA (SATA) interface, a parallel-ATA (PATA) interface, a small computer small interface (SCSI) interface, an enhanced small disk interface (ESDI), an integrated drive electronics (IDE) interface, a mobile industry processor interface (MIPI), a nonvolatile memory-express (NVM-e) interface, and a universal flash storage (UFS) interface.

The storage controller 110 may communicate with the first nonvolatile memory device 120 through the flash interface 116. The flash interface 116 may include a NAND interface.

Figure 4:
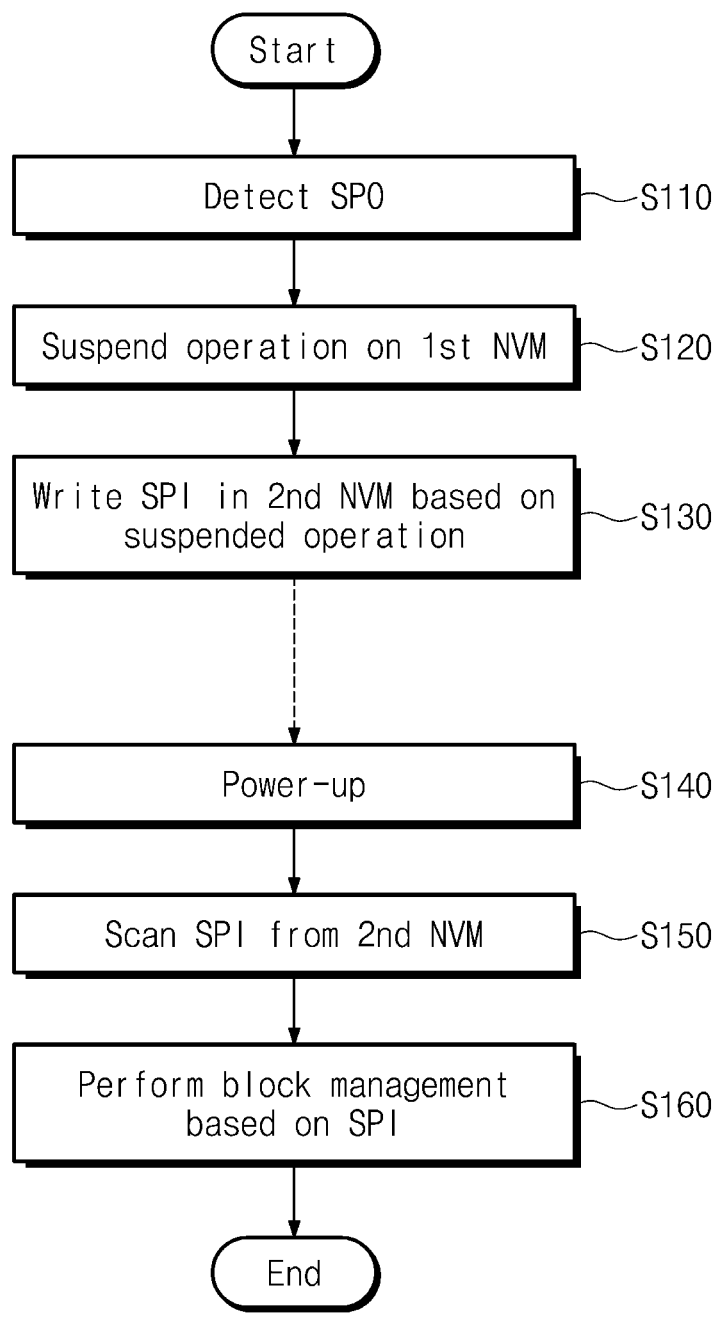
FIG. 4 is a flowchart illustrating an operation of a storage device of FIG. 1.

FIG. 4 is a flowchart illustrating an operation of a storage device of FIG. 1. Referring to FIGS. 1 and 4, in operation S110, the storage device 100 may detect sudden power-off. For example, the power management integrated circuit PMIC may detect shut-off of the power PWR provided from the host 11. The power management integrated circuit PMIC may provide the SPO signal to the storage controller 110 in response to detecting the sudden power-off.

In some example embodiments, as described above, the power management integrated circuit PMIC may be configured to detect the sudden power-off associated with each component of the storage device 100, or each component of the storage device 100 may be configured to detect the sudden power-off through a power detector included in each component.

In operation S120, the storage device 100 may suspend an operation of the first nonvolatile memory device 120. For example, at a time point when the sudden power-off is detected, the first nonvolatile memory device 120 may be performing an operation such as a program operation, a read operation, or an erase operation. The storage controller 110 may suspend an operation (e.g., a program operation, a read operation, or an erase operation) being currently performed in the first nonvolatile memory device 120 in response to the SPO signal. In some example embodiments, the storage controller 110 may provide the first nonvolatile memory device 120 with a separate suspended command for suspending an operation of the first nonvolatile memory device 120.

In operation S130, the storage device 100 may write the suspension information SPI into the second nonvolatile memory device 130 based on the suspended operation. For example, the storage controller 110 may write a command corresponding to the suspended operation and an address corresponding to the suspended operation as the suspension information SPI. That is, in the case where a program operation associated with a first memory block of a plurality of memory blocks of the first nonvolatile memory device 120 is suspended, the storage controller 110 may write an address of the first memory block and a program command as the suspension information SPI. Below, for convenience of description, the command included in the suspension information SPI is called a "suspended command", and the address included in the suspension information SPI is called a "suspended address".

Afterwards, in operation S140, the storage device 100 may be powered up.

After powered up, in operation S150, the storage device 100 may scan the suspension information SPI stored in the second nonvolatile memory device 130. For example, in an initialization operation according to power-up, the storage controller 110 may read the suspension information SPI stored in the second nonvolatile memory device 130.

In operation S160, the storage device 100 may perform a block management operation based on the suspension information SPI. For example, the storage controller 110 may perform block management such as processing an invalid block on a memory block, data migration, or adjusting GC priorities based on a suspended command and a suspended address included in the suspension information SPI.

In some example embodiments, in the case where the sudden power-off associated with the first nonvolatile memory device 120 is detected, operations according to the flowchart of FIG. 4 may be performed. In some example embodiments, in the case where the sudden power-off is detected with regard to the second nonvolatile memory device 130 and the sudden power-off is not detected with regard to the first nonvolatile memory device 120, a separate suspension operation may not be performed, and a general operation (e.g., a program operation or a read operation) of the first nonvolatile memory device 120 may be continuously performed.

Figure 5:
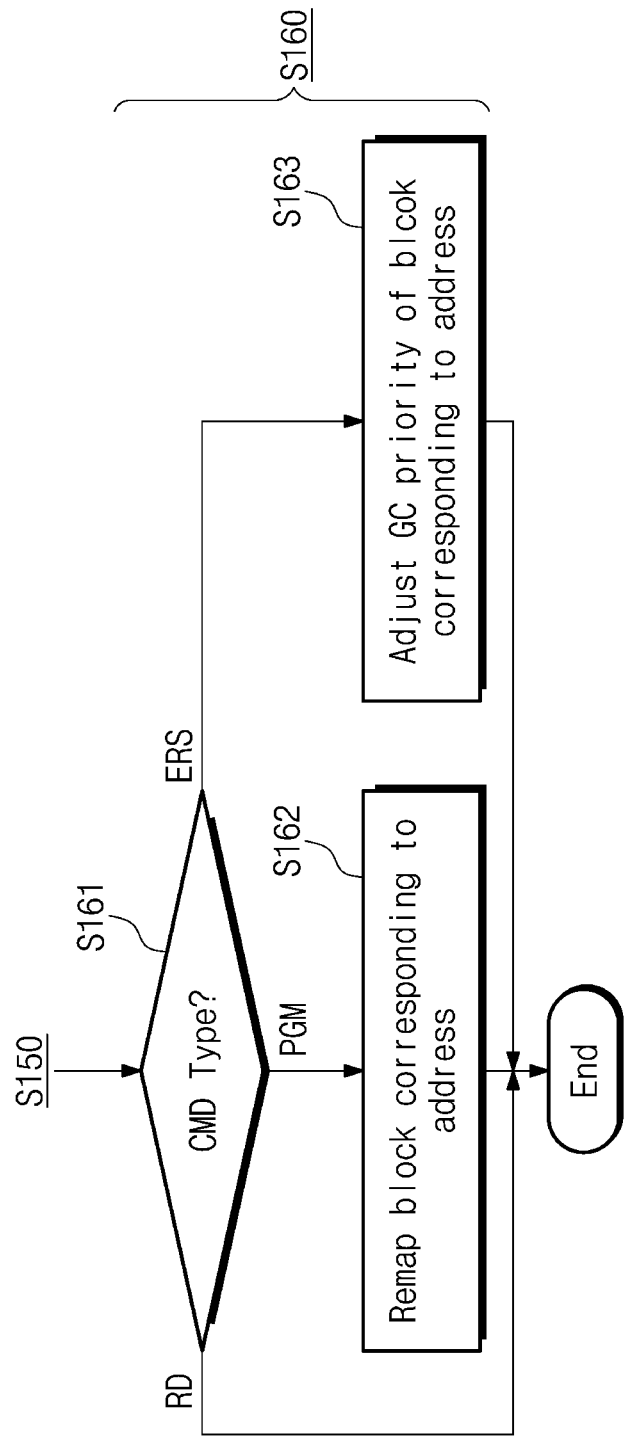
FIG. 5 is a flowchart illustrating operation S160 of FIG. 4.

FIG. 5 is a flowchart illustrating operation S160 of FIG. 4. Referring to FIGS. 1, 4, and 5, the storage device 100 may perform operation S160 after operation S150. Operation S160 may include operation S161 to operation S163.

In operation S161, the storage device 100 may determine a command type. For example, the storage controller 110 may determine whether a suspended command is a read command RD, a program command PGM, or an erase command ERS.

When a suspended command is the read command RD, the storage device 100 may not perform a separate block management operation. For example, as described above, the suspended command indicates a command corresponding to an operation suspended in the first nonvolatile memory device 120. In the case where an operation (e.g., a read operation) corresponding to the read command RD is suspended, a change in data stored in the first nonvolatile memory device 120 may not be made. That is, in the case where the suspended command is the read command RD, data stored in the first nonvolatile memory device 120 may not be changed. Accordingly, even though the storage device 100 does not perform a separate block management operation, the data stored in the first nonvolatile memory device 120 may be maintained.

In the case where the suspended command is the program command PGM, in operation S162, the storage device 100 may remap a memory block corresponding to the suspended address. For example, the storage controller 110 may set the memory block corresponding to the suspended address to an invalid block, may perform migration of data stored in the memory block set to the invalid block to any other memory block (e.g., a free memory block), and may update a mapping table.

In detail, in the case where a program operation associated with the first memory block of the first nonvolatile memory device 120 is suspended, data may not be normally stored to the first memory block. That is, since the reliability of data to be stored to the first memory block is not secured, the storage controller 110 may set the first memory block to an invalid block. However, to secure the reliability of data previously stored in the first memory block (e.g., data stored before the suspended program operation), data stored in the first memory block set to the invalid block may migrate to any other memory block (e.g., a free memory block). In this case, the storage controller 110 may map a logical address of the data stored in the first memory block onto a physical address of the free memory block.

As described above, the reliability of data previously stored in the first memory block may be secured by setting the first memory block, the program operation of which is suspended, to an invalid block, performing migration of the data stored in the first memory block to the free memory block, and mapping a logical address of the migration data onto a physical address of the free memory block. Below, for convenience of description, the above-described operations are called a "remapping operation on the first memory block". That is, in the case where the suspended command is the program command PGM, the storage controller 110 may perform a remapping operation on a memory block corresponding to a suspended address.

In the case where the suspended command is the erase command ERS, in operation S163, the storage device 100 may adjust a GC priority of a memory block corresponding to the suspended address. For example, in the case where the suspended command is the erase command ERS, the storage controller 110 may set the memory block corresponding to the suspended address to an invalid block and may make a GC priority of the memory block high. The storage controller 110 may perform garbage collection depending on GC priorities. That is, the storage controller 110 may first select a memory block corresponding to a suspended address (e.g., a memory block, the erase operation of which is suspended)

as a target memory block and may perform an erase operation on the target memory block.

Since threshold voltages of memory cells of the memory block, the erase operation of which is suspended, are lower than those of memory cells of a general memory block (e.g., a memory block in which user data are stored), the memory block, the erase operation of which is suspended, may be erased more quickly than the general memory block. That is, as the memory block, the erase operation of which is suspended, is selected first of all, the erase operation may be performed quickly on the target memory block, thus improving an overall speed of a garbage collection operation.

Figure 6A:
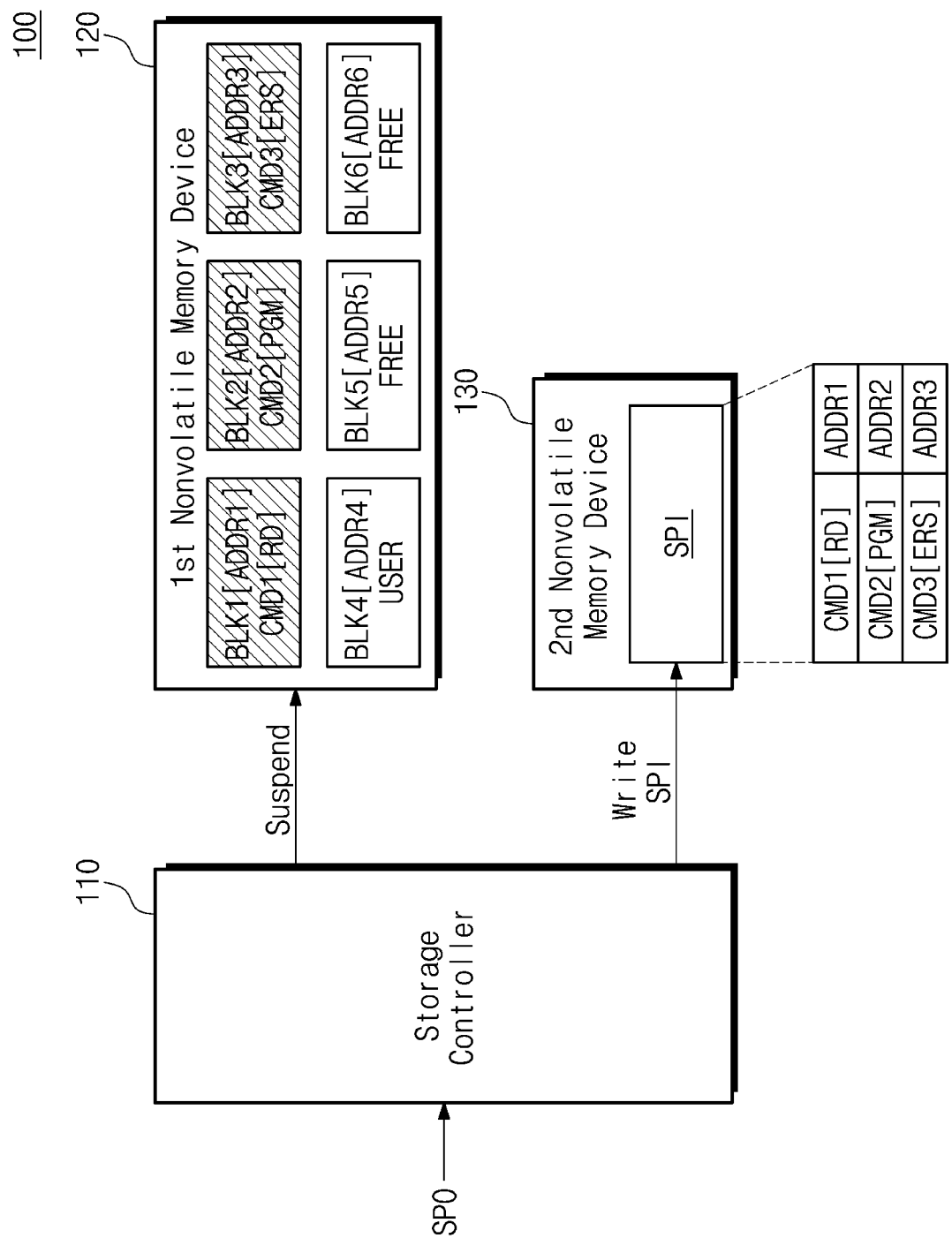
FIGS. 6A to 6C are diagrams for describing an operation of a storage device according to the flowcharts of FIGS. 4 and 5.
Figure 6B:
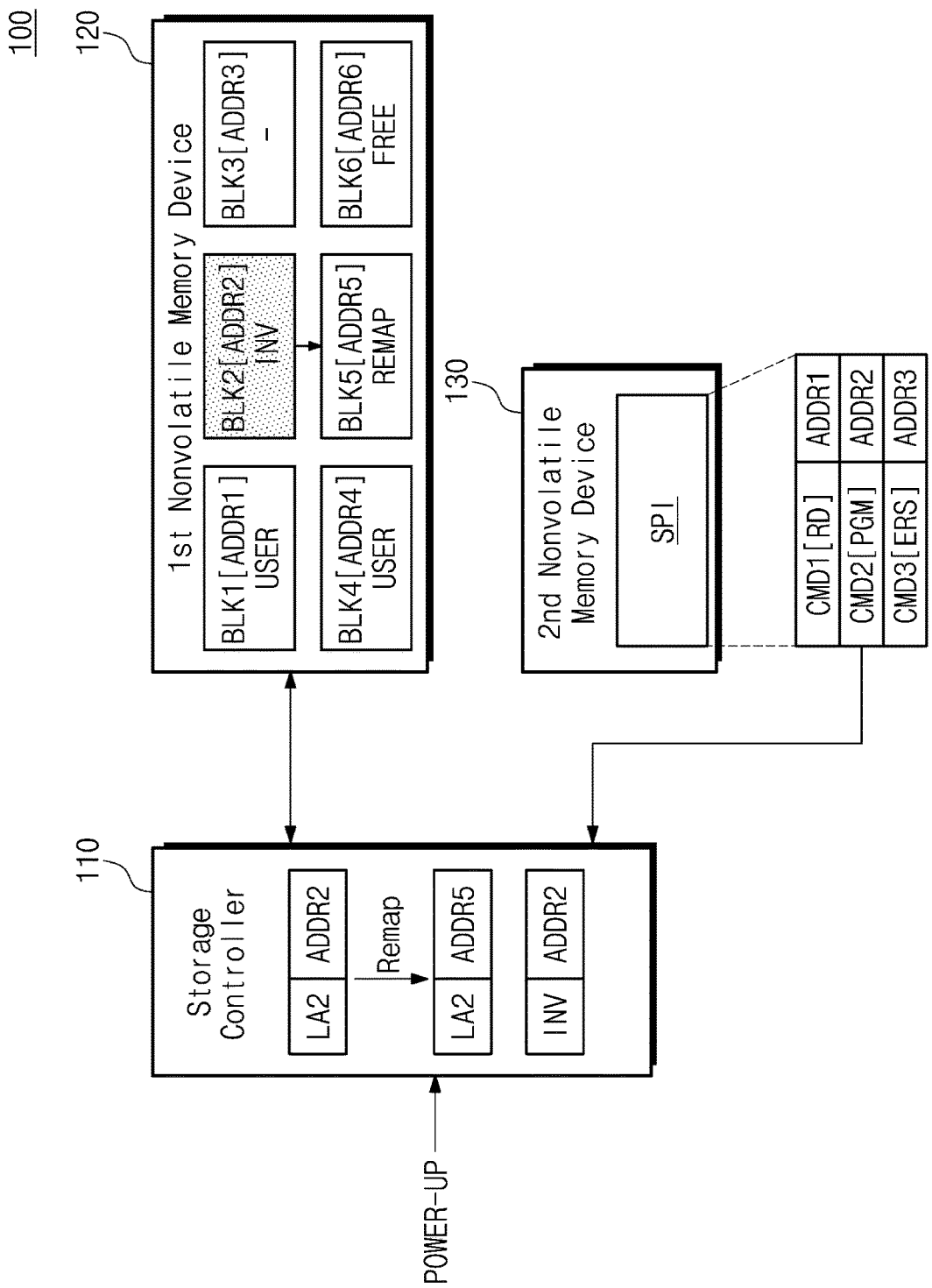
Figure 6C:
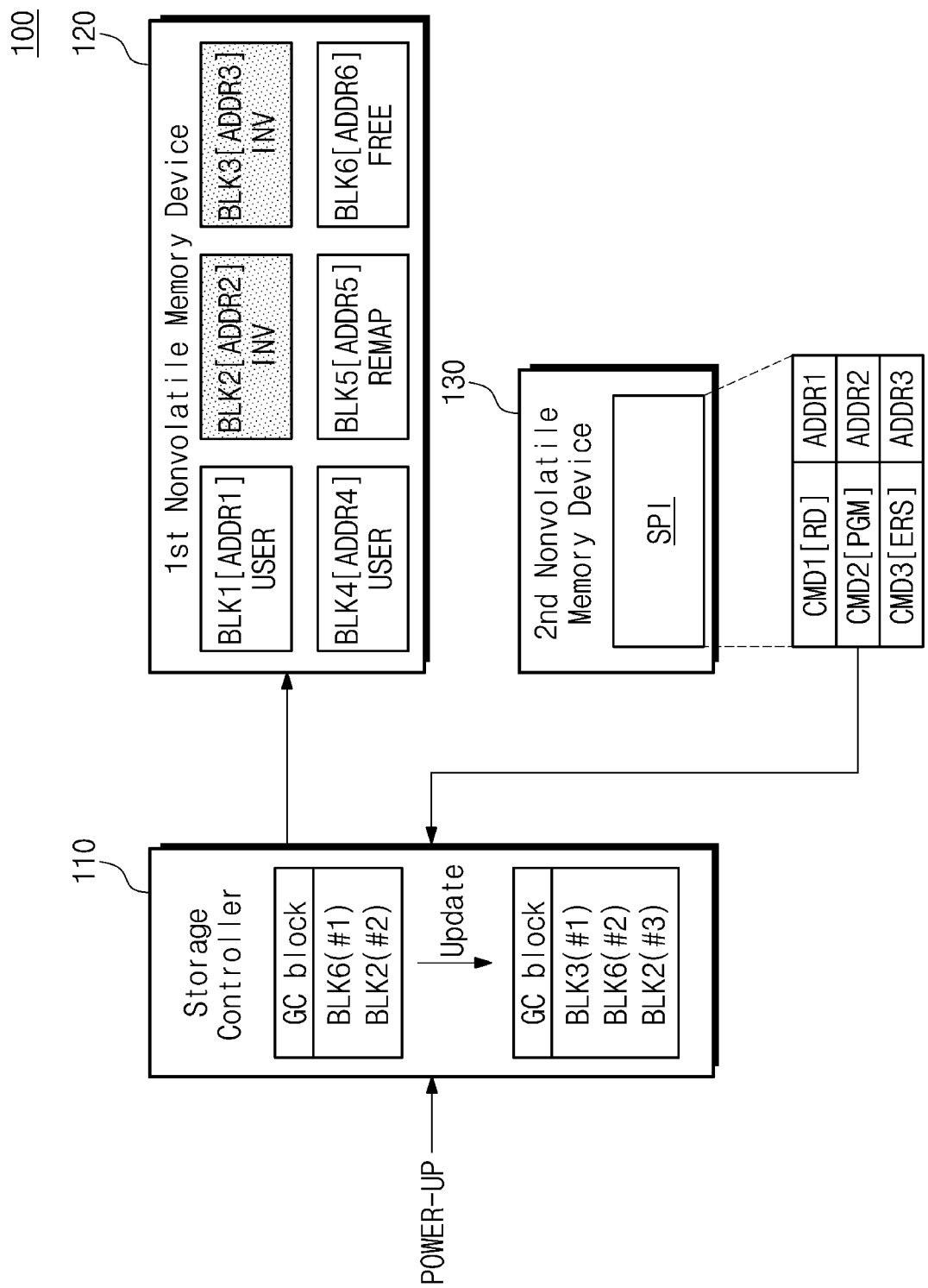

FIGS. 6A to 6C are diagrams for describing an operation of a storage device according to the flowcharts of FIGS. 4 and 5. For convenience of description, it is assumed that the first nonvolatile memory device 120 includes first to sixth memory blocks BLK1 to BLK6 and the first to sixth memory blocks BLK1 to BLK6 correspond to first to sixth addresses ADDR1 to ADDR6, respectively. Also, it is assumed that the first nonvolatile memory device 120 is performing a read operation, a program operation, and an erase operation on the first memory block BLK1, the second memory block BLK2, and the third memory block BLK3, respectively. However, the inventive concepts are not limited thereto.

Referring to FIG. 6A, the sudden power-off may occur at the storage device 100. The power management integrated circuit PMIC may detect the sudden power-off and may provide the SPO signal to the storage controller 110. The storage controller 110 may suspend the operations (e.g., the read operation, the program operation, and the erase operation) being performed in the first nonvolatile memory device 120 in response to the SPO signal.

Afterwards, the storage controller 110 may write information about the suspended operations into the second nonvolatile memory device 130 as the suspension information SPI. The suspension information SPI may include suspended commands and suspended addresses associated with the suspended operations.

For example, as illustrated in FIG. 6A, in the case where the read operation being performed at the first memory block BLK1 is suspended, the storage controller 110 may write a first suspended command CMD1 indicating the read operation RD suspended at the first memory block BLK1 and a first suspended address ADDR1 corresponding to the first memory block BLK1 into the second nonvolatile memory device 130 as the suspension information SPI. Likewise, in the case where the program operation and the erase operation being performed at the second memory block BLK2 and the third memory block BLK3 are suspended, the storage controller 110 may write second and third suspended commands CMD2 and CMD3 indicating the program and erase operations PGM and ERS suspended at the second and third memory blocks BLK2 and BLK3 and second and third suspended addresses ADDR2 and ADDR3 corresponding to the second and third memory blocks BLK2 and BLK3 into the second nonvolatile memory device 130 as the suspension information SPI.

Afterwards, as illustrated in FIGS. 6B and 6C, the storage device 100 may be powered up. In this case, the storage controller 110 may perform a block management operation based on the suspension information SPI stored in the second nonvolatile memory device 130.

For example, as illustrated in FIG. 6B, the storage controller 110 may perform a remapping operation on a particular memory block based on the suspension information SPI stored in the second nonvolatile memory device 130. In detail, the storage controller 110 may recognize that the program operation PGM of the second memory block BLK2 corresponding to the second suspended address ADDR2 is suspended, based on the suspension information SPI. In this case, the storage controller 110 may perform the remapping operation on the second memory block BLK2.

That is, as described above, the storage controller 110 may set the second memory block BLK2 to an invalid block INV and may perform migration of data stored in the second memory block BLK2 to the fifth memory block BLK5. According to the above migration operation, the storage controller 110 may remap or update the mapping table by mapping a second logical address LA2 corresponding to the data stored in the second memory block BLK2 onto the fifth address ADDR5 of the fifth memory block BLK5 and marking the second address ADDR2 of the second memory block BLK2 to an invalid block INV.

That is, afterwards, in the case where data corresponding to the second logical address LA2 is accessed by the host 11, the storage controller 110 may access data stored in the fifth memory block BLK5 based on the remapped mapping table.

As illustrated in FIG. 6C, the storage controller 110 may adjust a GC priority of a particular memory block based on the suspension information SPI stored in the second nonvolatile memory device 130. For example, the storage controller 110 may recognize that the erase operation ERS of the third memory block BLK3 corresponding to the third suspended address ADDR3 is suspended, based on the suspension information SPI stored in the second nonvolatile memory device 130. In this case, as described above, the storage controller 110 may make a GC priority of the third memory block BLK3 high.

In detail, as illustrated in FIG. 6C, the sixth memory block BLK6 may be a free memory block, and the second memory block BLK2 may be an invalid block. The storage controller 110 may determine a GC priority of the sixth memory block BLK6 as a first priority #1 and may determine a GC priority of the second memory block BLK2 as a second priority #2. In this state, in the case where garbage collection is performed, the storage controller 110 may select the sixth memory block BLK6 having a high priority as a target memory block and may perform an erase operation on the sixth memory block BLK6.

In the case where an erase operation of the third memory block BLK3 is suspended in a sudden power-off situation and then the storage device 100 is powered up, the storage controller 110 may recognize that the erase operation of the third memory block BLK3 is suspended, based on the suspension information SPI stored in the second nonvolatile memory device 130. In this case, the storage controller 110 may determine a GC priority of the third memory block BLK3 as a first priority #1 and may adjust or update a GC priority of the sixth and second memory blocks BLK6 and BLK2 to second and third priorities #2 and #3. In this state, in the case where garbage collection is performed, the storage controller 110 may select the third memory block BLK3 having a highest priority as a target memory block and may perform an erase operation on the target memory block.

In some example embodiments, a GC priority of a memory block set to an invalid block may be further adjusted according to a P/E cycle of the memory block set to the invalid block. For example, the storage controller 110 may perform wear-leveling on a plurality of memory blocks of the first nonvolatile memory device 120. That is, the storage controller 110 may make a GC priority of a memory block having a first P/E cycle higher than a GC priority of a memory block having a second P/E cycle greater than the first P/E cycle, and thus, in garbage collection, the memory block having the first P/E cycle may be first selected as a target memory block. In this case, in the case where the memory block having the second P/E cycle is an erase-suspended memory block, the storage controller 110 may adjust GC priorities such that the memory block having the second P/E cycle is first selected as a target memory block. However, in the case where a difference between the second P/E cycle and the first P/E cycle is not smaller than a reference value (e.g., the second P/E cycle is greater than the first P/E cycle as much as the reference value or greater), the storage controller 110 may adjust GC priorities such that the memory block having the first P/E cycle is first selected as a target memory block, for wear-leveling management of the memory blocks.

As described above, in a sudden power-off situation, the storage device 100 may suspend an operation of the first nonvolatile memory device 120 and may write information about the suspended operation into the second nonvolatile memory device 130 as the suspension information SPI. Afterwards, in the case where the storage device 100 is powered up, the storage device 100 may perform a remapping operation or a GC priority adjusting operation on the first nonvolatile memory device 120 based on the suspension information SPI stored in the second nonvolatile memory device 130.

Figure 7A:
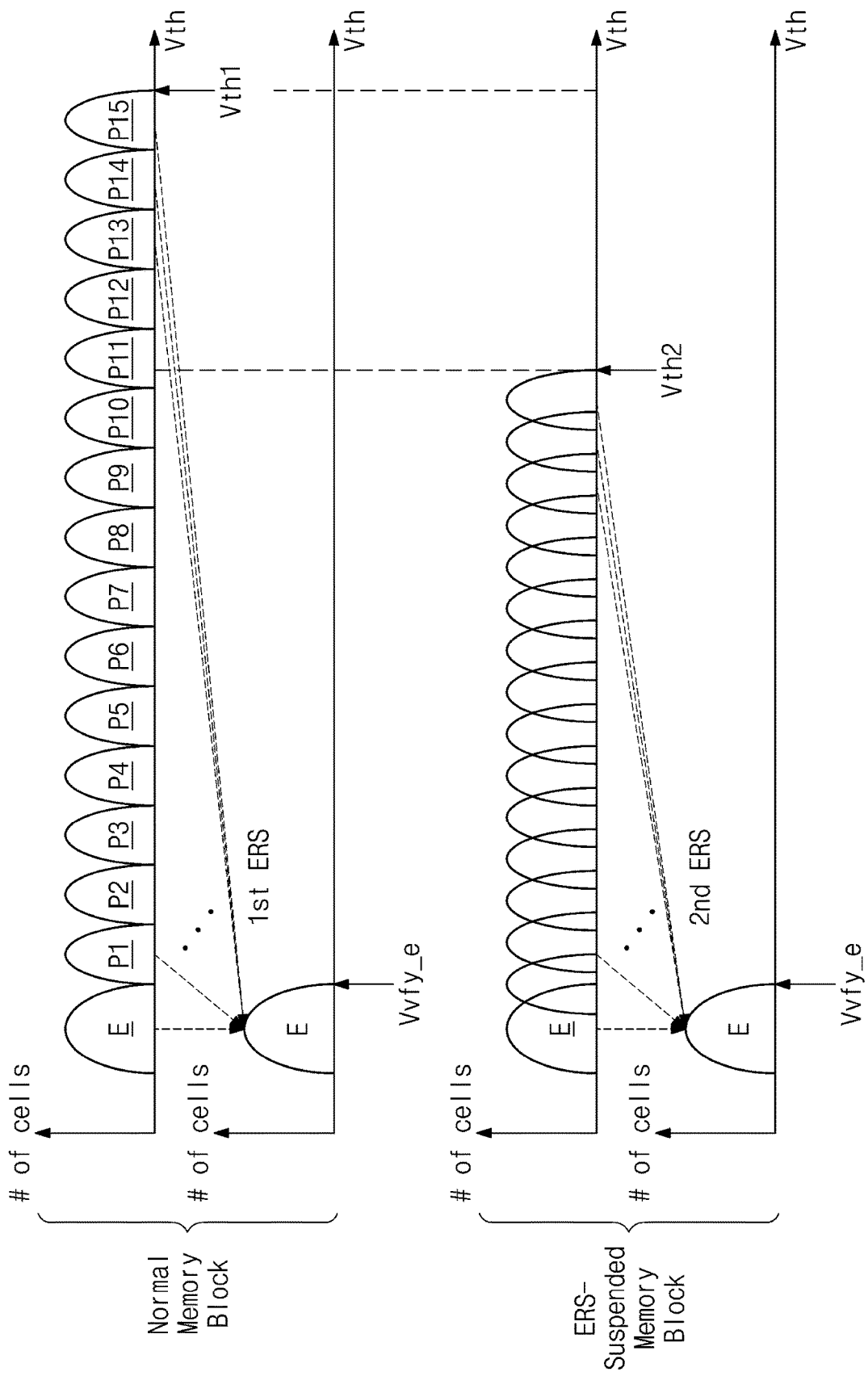
FIGS. 7A and 7B are diagrams for describing an erase operation according to a way to perform a verify operation before an erase operation.
Figure 7B:
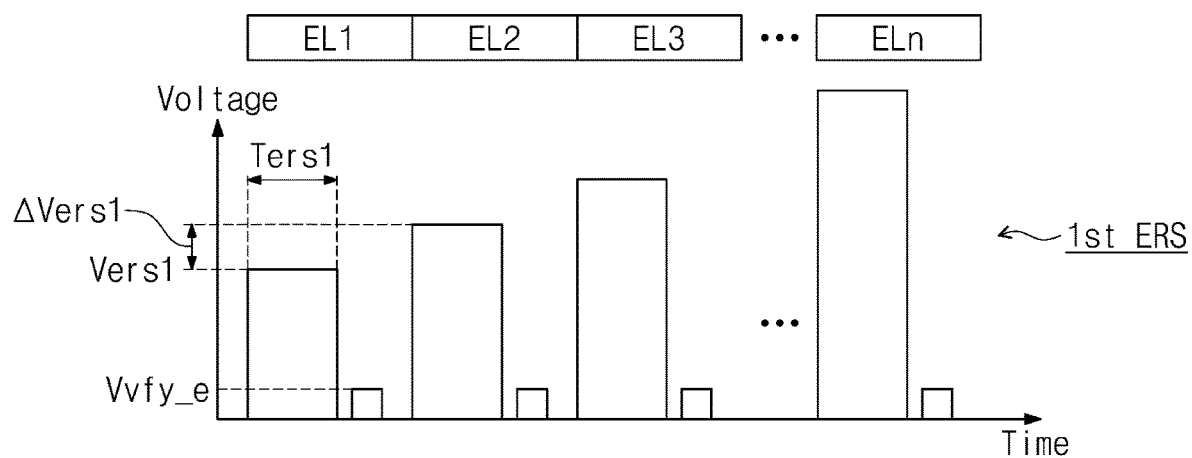
Figure 7B:
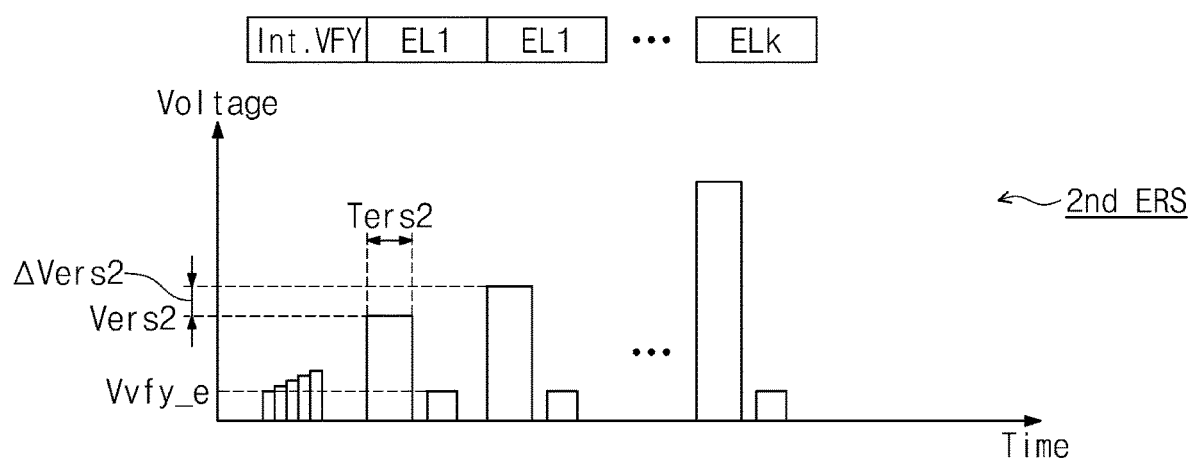

FIGS. 7A and 7B are diagrams for describing an erase operation according to a way to perform a verify operation before an erase operation. Referring to FIGS. 1, 7A, and 7B, as illustrated in FIG. 7A, each of memory cells of a normal memory block of a plurality of memory blocks included in the first nonvolatile memory device 120 may have any one of an erase state "E" and 1st to 15th program states P1 to P15. As a first erase operation 1st ERS is performed on the normal memory block, the memory cells of the normal memory block may have the erase state "E". For example, as illustrated in FIG. 7B, the storage device 100 may perform an erase operation on the normal memory block by performing the first erase operation 1st ERS including a plurality of erase loops EL1 to ELn. Each of the plurality of erase loops EL1 to ELn may include decreasing threshold voltages of memory cells by applying an erase voltage thereto; and verifying whether the memory blocks are normally erased, by applying an erase verification voltage Vvfy_e.

In contrast, memory cells of a memory block (e.g., the third memory block BLK3 of FIG. 6) (for convenience of description, referred to as an "erase-suspended memory block"), the erase operation of which is suspended, may form a threshold voltage distribution illustrated in FIG. 7A. In this case, an upper limit value Vth2 of the threshold voltage distribution of the memory cells in the erase-suspended memory block may be lower than an upper limit value Vth1 of a threshold voltage distribution of the memory cells in the normal memory block. In this case, as a second erase operation 2nd ERS is performed on the erase-suspended memory block, the memory cells of the erase-suspended memory block may have the erase state "E". For example, the storage device 100 may perform the second erase operation 2nd ERS including an initial verification interval Int. VFY and a plurality of erase loops EL1 to ELk as illustrated in FIG. 7B.

The initial verification interval Int. VFY may be used to detect an upper limit value (e.g., Vth2) of the threshold voltage distribution of the memory cells in the erase-suspended memory block by applying a plurality of verification voltages to the erase-suspended memory block. The storage device 100 may perform the plurality of erase loops EL1 to ELk, depending on a result of the initial verification interval Int. VFY. In this case, a time Ters2 to apply an erase voltage in each of the plurality of erase loops EL1 to ELk, the number of the plurality of erase loops EL1 to ELk, or a magnitude of an initial erase voltage Vers2 may be determined based on the result of the initial verification interval Int. VFY. For example, as a magnitude of the upper limit value Vth2 determined as the result of the initial verification interval Int. VFY increases, the time Ters2 to apply the erase voltage in each of the plurality of erase loops EL1 to ELk, the number of the plurality of erase loops EL1 to ELk, or the magnitude of the initial erase voltage Vers2 may increase.

In some example embodiments, the time Ters2 to apply the erase voltage in each of the plurality of erase loops EL1 to ELk of the second erase operation 2nd ERS, the number of the plurality of erase loops EL1 to ELk, or the magnitude of the initial erase voltage Vers2 may be smaller than a time Ters1 to apply an erase voltage in each of the plurality of erase loops EL1 to ELn of the first erase operation 1st ERS, the number of the plurality of erase loops EL1 to ELn, or a magnitude of an initial erase voltage Vers1. That is, a time to perform the second erase operation 2nd ERS may be shorter than a time to perform the first erase operation 1st ERS.

As described above, the storage controller 110 may perform different erase operations on a normal memory block and an erase-suspended memory block. For example, the storage controller 110 may perform the first erase operation 1st ERS on the normal memory block and may perform the second erase operation 2nd ERS on the erase-suspended memory block. As described above, since a time to perform the second erase operation 2nd ERS is shorter than a time to perform the first erase operation 1st ERS, the erase-suspended memory block may be first selected as a target memory block such that the second erase operation 2nd ERS is performed, and thus, a time taken to perform garbage collection may decrease.

Figure 8A:
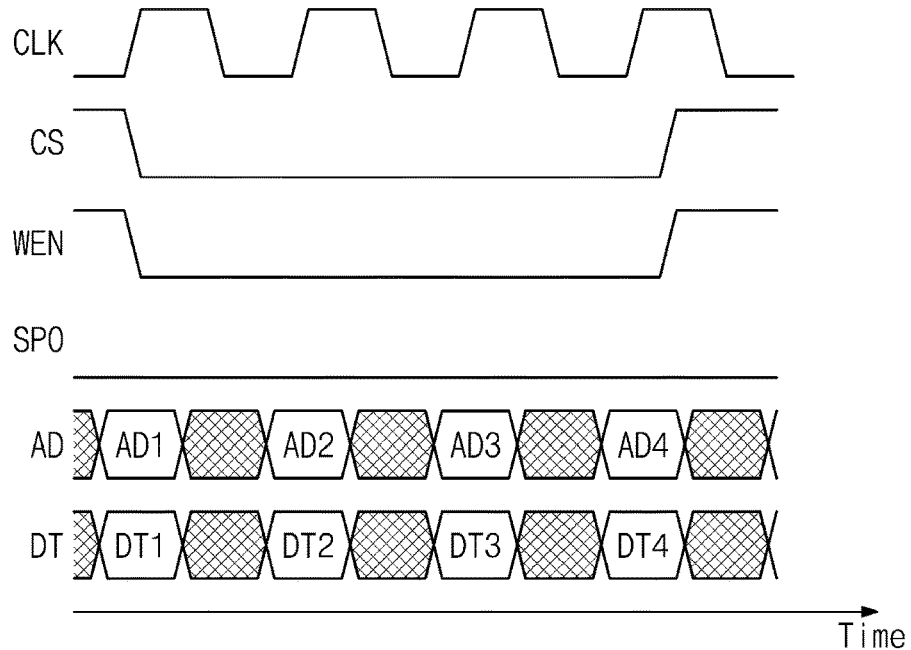
FIGS. 8A and 8B are timing diagrams illustrating an operation of writing suspension information to a second nonvolatile memory device.
Figure 8B:
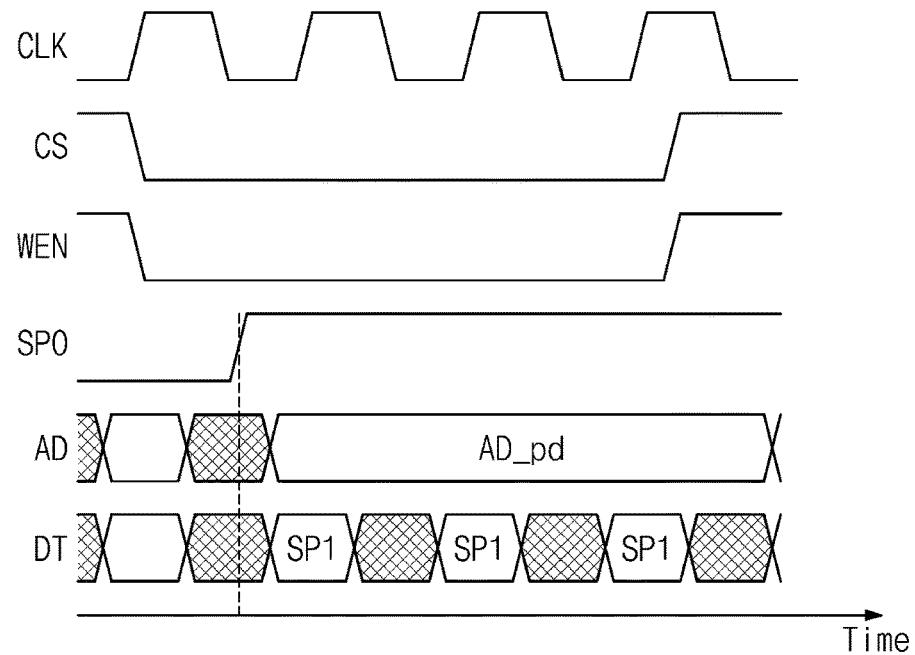

FIGS. 8A and 8B are timing diagrams illustrating an operation of writing suspension information to a second nonvolatile memory device. The timing diagrams illustrated in FIGS. 8A and 8B may be example timing diagrams for describing an operation of a second nonvolatile memory device, and the inventive concepts are not limited thereto. For example, the second nonvolatile memory device 130 may be configured to communicate with the storage controller 110 based on any one of various interfaces.

Referring to FIGS. 1, 3, 8A, and 8B, the second nonvolatile memory device 130 may operate in response to signals received from the nonvolatile memory manager 114. For example, as illustrated in FIG. 8A, the second nonvolatile memory device 130 may receive addresses AD1 to AD4 and data DT1 to DT4 in synchronization with a clock signal CLK from the nonvolatile memory manager 114 of the storage controller 110, during an active interval (e.g., an interval of logic low) of a chip select signal CS and a write enable signal WEN. The second nonvolatile memory device 130 may write the received data DT1 to DT4 into an area corresponding to the received addresses AD1 to AD4.

As illustrated in FIG. 8B, in the case where the sudden power-off SPO occurs, the storage controller 110 may activate the SPO signal (e.g., may allow the SPO signal to transition to logic low) and may provide a particular address AD_pd and the suspension information SPI to the second nonvolatile memory device 130 after a given time passes. The second nonvolatile memory device 130 may write the suspension information SPI into an area corresponding to the received particular address AD_pd in response to the SPO signal.

In some example embodiments, the second nonvolatile memory device 130 may perform an operation of writing the suspension information SPI after a given time (e.g., several cycles of the clock signal CLK) passes from a time point when the SPO signal is activated. In some example embodiments, the particular address AD_pd may be an address corresponding to an area, which is determined in advance such that the suspension information SPI is written, from among storage areas of the second nonvolatile memory device 130. In some example embodiments, the second nonvolatile memory device 130 may operate in a burst mode for the purpose of writing the suspension information SPI.

The above operation of the second nonvolatile memory device 130 is an example, and it may be understood that an operation of the second nonvolatile memory device 130 may be variously changed or modified without departing from the technical idea of the inventive concepts.

Figure 9:
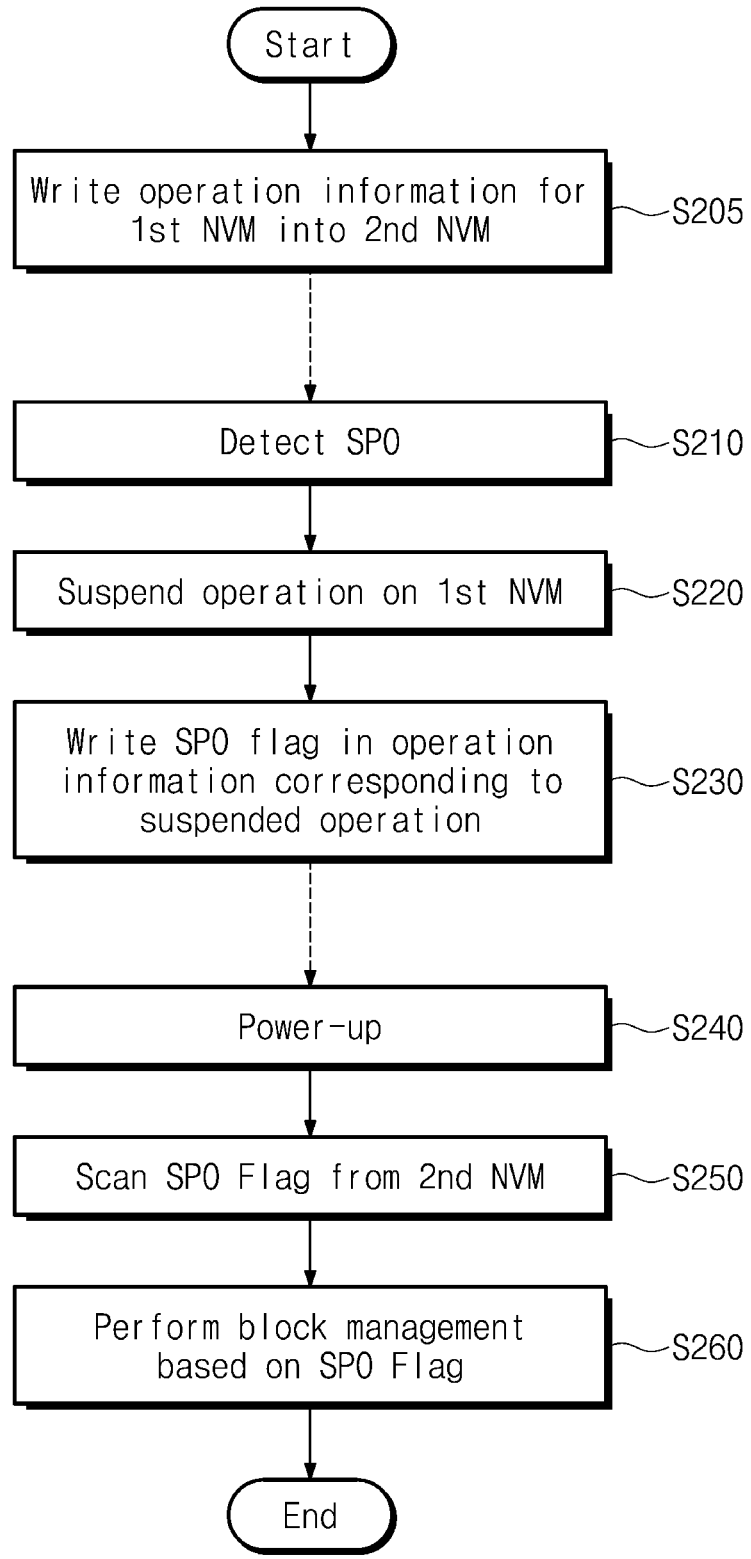
FIGS. 9, 10A, and 10B are diagrams for describing an operation of a storage device according to some example embodiments of the inventive concepts.
Figure 10A:
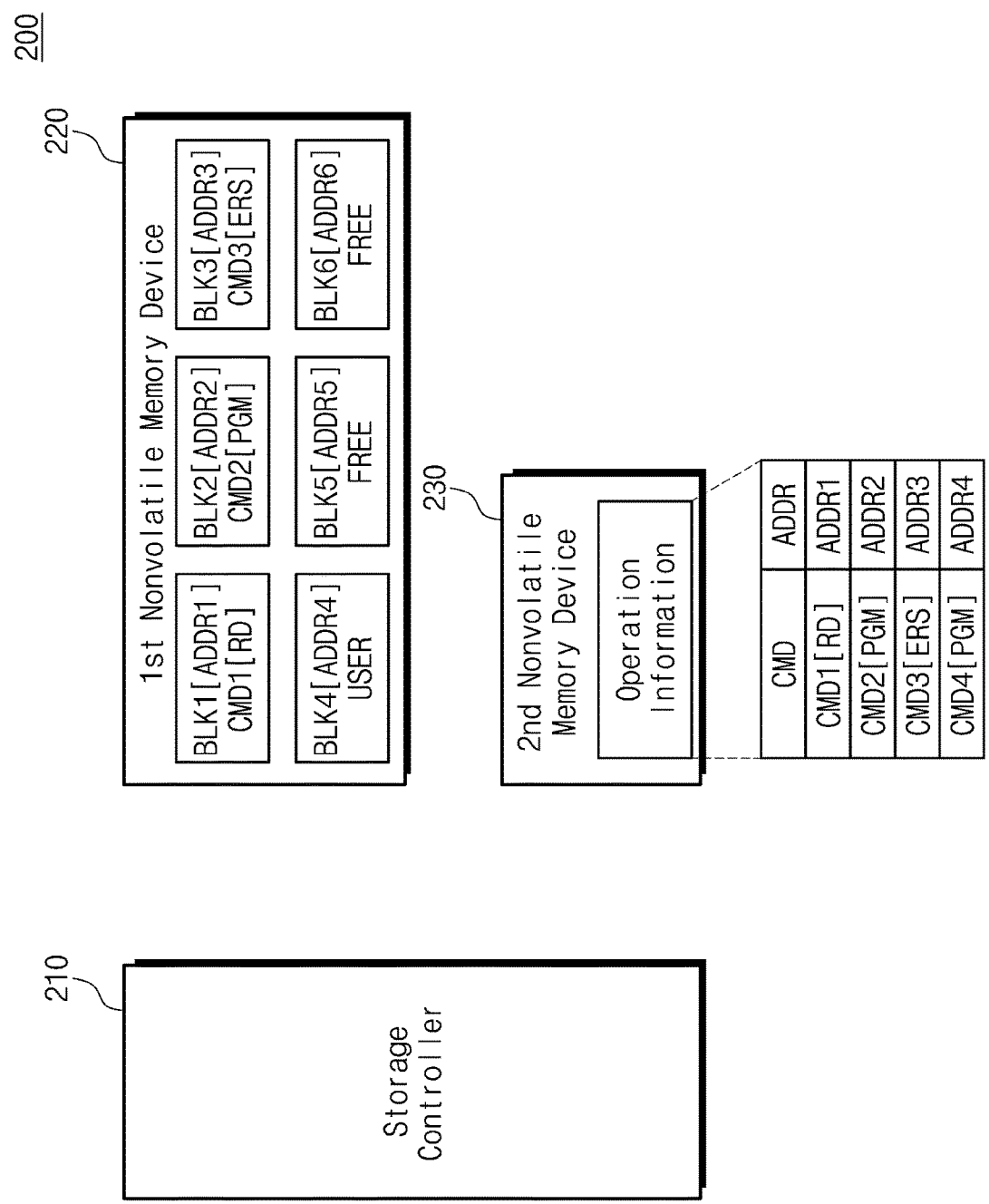
Figure 10B:
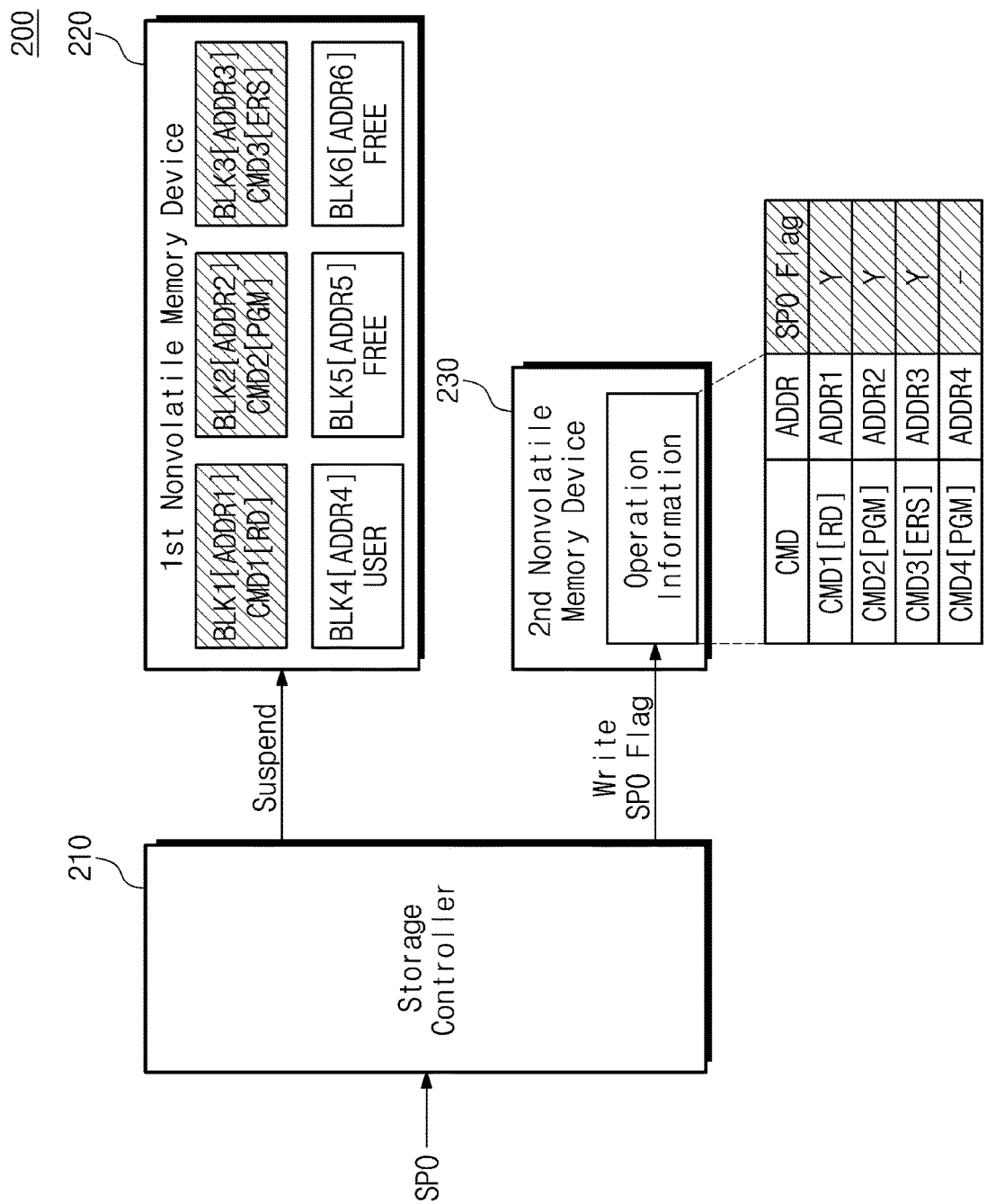

FIGS. 9, 10A, and 10B are diagrams for describing an operation of a storage device according to some example embodiments of the inventive concepts. Referring to FIGS. 9, 10A, and 10B, in operation S205, a storage device 200 may write and mange operation information about a first nonvolatile memory device 220 into a second nonvolatile memory device 230. For example, as illustrated in FIG. 10A, the storage device 200 may be performing the read operation RD on the first memory block BLK1 of the first nonvolatile memory device 220, the program operation PGM on the second memory block BLK2, and the erase operation ERS on the third memory block BLK3, and a program operation PGM on the fourth memory block BLK4. In this case, the storage device 200 may write and manage information of the operations being performed in the first nonvolatile memory device 220 into the second nonvolatile memory device 230 as the operation information.

The operation information stored in the second nonvolatile memory device 230 may include information about a command and an address associated with an operation being performed in the first nonvolatile memory device 220. In some example embodiments, the operation information stored in the second nonvolatile memory device 230 may be management information which is managed separately or a command queue for the first nonvolatile memory device 220 managed by the storage controller 110.

Afterwards, the storage device 200 may perform operation S210 and operation S220. The storage device 200 may perform operation S210 and operation S220, that is, detecting sudden power-off and suspending an operation of the first nonvolatile memory device 220. Operation S210 and operation S220 are similar to operation S110 and operation S120 of FIG. 4, and thus, additional description will be omitted to avoid redundancy.

In operation S230, the storage device 200 may write a SPO flag in the operation information corresponding to the suspended operation. For example, as illustrated in FIG. 10B, a storage controller 210 may suspend an operation being performed in the first nonvolatile memory device 220 in response to the SPO signal. In this case, the program operation PGM of the fourth memory block BLK4 may be completed at a time point when the SPO signal is received, and the read operation RD, the program operation PGM, and the erase operation ERS being performed in the first, second, and third memory blocks BLK1, BLK2, and BLK3 may be suspended.

The storage controller 210 may write a SPO flag in operation information corresponding to a suspended operation. For example, in the case where the read operation RD, the program operation PGM, and the erase operation ERS being performed in the first, second, and third memory blocks BLK1, BLK2, and BLK3 are suspended, the storage controller 210 may write SPO flags in pieces of operation information (e.g., CMD1/ADDR1, CMD2/ADDR2, CMD3/ADDR3) corresponding to the first to third memory blocks BLK1 to BLK3 among the operation information stored in the second nonvolatile memory device 230. Since the program operation PGM of the fourth memory block BLK4 is completed, the storage controller 210 may not write a separate SPO flag in operation information CMD4/ADD4 corresponding to the fourth memory block BLK4.

That is, the storage controller 210 may store operation information (e.g., a command and an address) about an operation being performed in the first nonvolatile memory device 220 to the second nonvolatile memory device 230 for management, and may write a SPO flag in operation information corresponding to an operation suspended in the first nonvolatile memory device 220 when the sudden power-off occurs.

Afterwards, in operation S240, the storage device 200 may be powered up.

In operation S250, the storage device 200 may scan a SPO flag from the operation information stored in the second nonvolatile memory device 230. For example, the storage controller 210 may recognize an operation suspended in the first nonvolatile memory device 220 in the sudden power-off by scanning the SPO flag from the operation information stored in the second nonvolatile memory device 230.

Afterwards, in operation S260, the storage device 200 may perform a block management operation based on the scanned SPO flag. For example, as described above, the storage controller 210 may recognize an operation suspended in the first nonvolatile memory device 220 in the sudden power-off by scanning the SPO flag from the operation information stored in the second nonvolatile memory device 230. The storage controller 210 may perform a block management operation, such as a remapping operation or a GC priority adjusting operation described with reference to FIGS. 1 to 7B, based on the suspended operation. The block management operation is described above, and thus, a detailed description thereof will not be repeated here.

As described above, the storage device 200 may store operation information about an operation being performed in the first nonvolatile memory device 220 into the second nonvolatile memory device 230 for management. In the case where the sudden power-off occurs, the storage device 200 may suspend an operation being performed in the first nonvolatile memory device 220, and may write a SPO flag in operation information corresponding to the suspended operation, at the second nonvolatile memory device 230. Accordingly, when the sudden power-off occurs, once the storage device 200 writes a SPO flag into the second nonvolatile memory device 230 without completing an operation of the first nonvolatile memory device 220, the storage device 200 may cope with the sudden power-off by using an auxiliary power source of a smaller capacity. Also, in power-up after the sudden power-off, the storage device 200 may perform a block management operation based on the operation information and the SPO flag stored in the second nonvolatile memory device 230, and thus, the reliability of data stored in the first nonvolatile memory device 220 may be secured.

Figure 11:
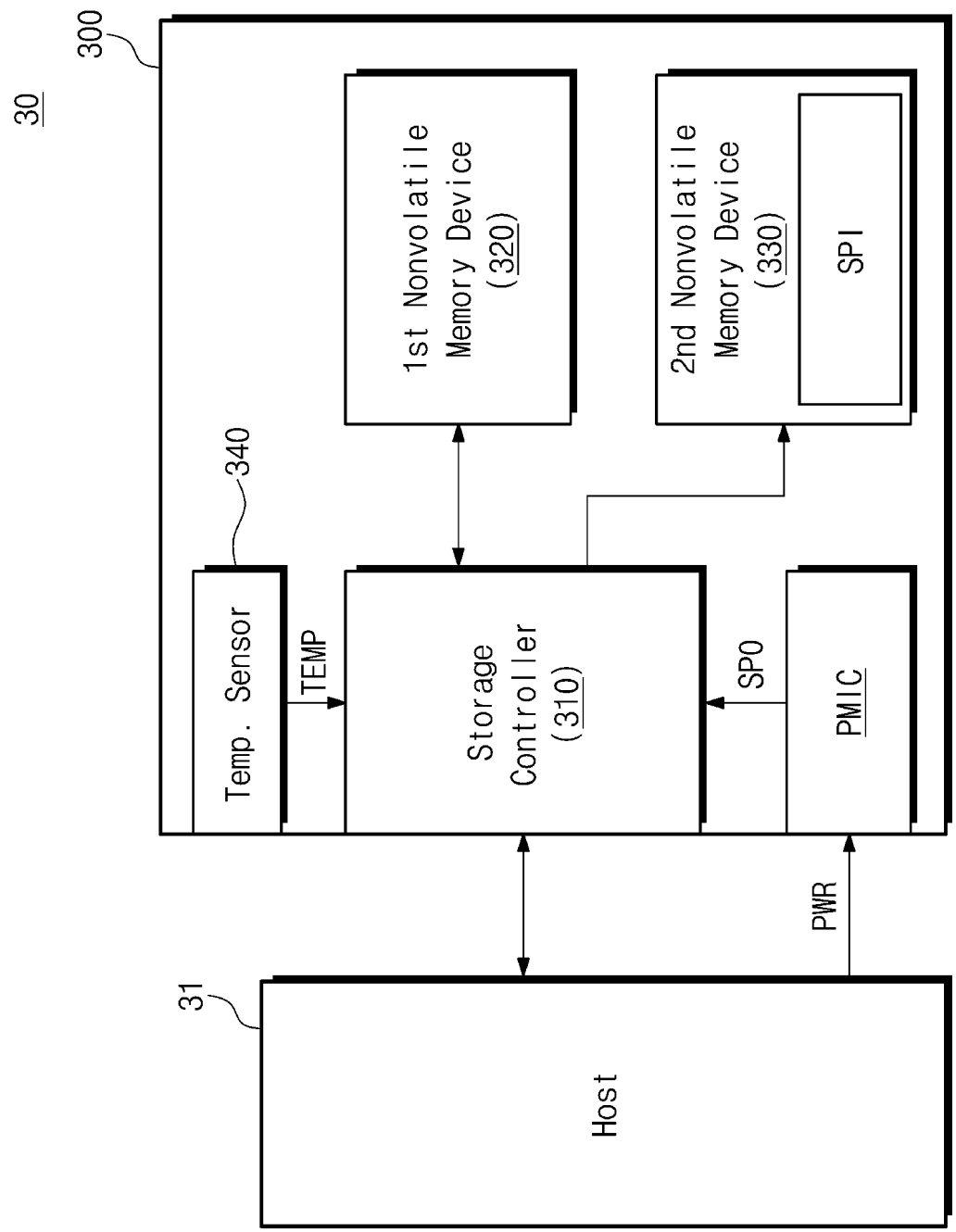
FIG. 11 is a block diagram illustrating a storage system according to some example embodiments of the inventive concepts.

FIG. 11 is a block diagram illustrating a storage system according to some example embodiments of the inventive concepts. Referring to FIG. 11, a storage system 30 may include a host 31 and/or a storage device 300. The storage device 300 may include a storage controller 310, a first nonvolatile memory device 320, a second nonvolatile memory device 330, a power management integrated circuit PMIC, and/or a temperature sensor 340. The host 31, the storage device 300, the storage controller 310, the first nonvolatile memory device 320, the second nonvolatile memory device 330, and the power management integrated circuit PMIC are described above, and thus, additional description will be omitted to avoid redundancy.

The temperature sensor 340 may detect a temperature of the storage device 300 and may provide temperature information TEMP about the detected temperature to the storage controller 310. The storage controller 310 may be configured to control the second nonvolatile memory device 330 based on the temperature information TEMP. For example, the second nonvolatile memory device 330 may adjust the number of times that the second nonvolatile memory device 230 is rewritten, based on a temperature of the storage device 300. In some example embodiments, when sudden power-off occurs, the storage controller 310 may write the temperature information TEMP into the second nonvolatile memory device 330.

Figure 12:
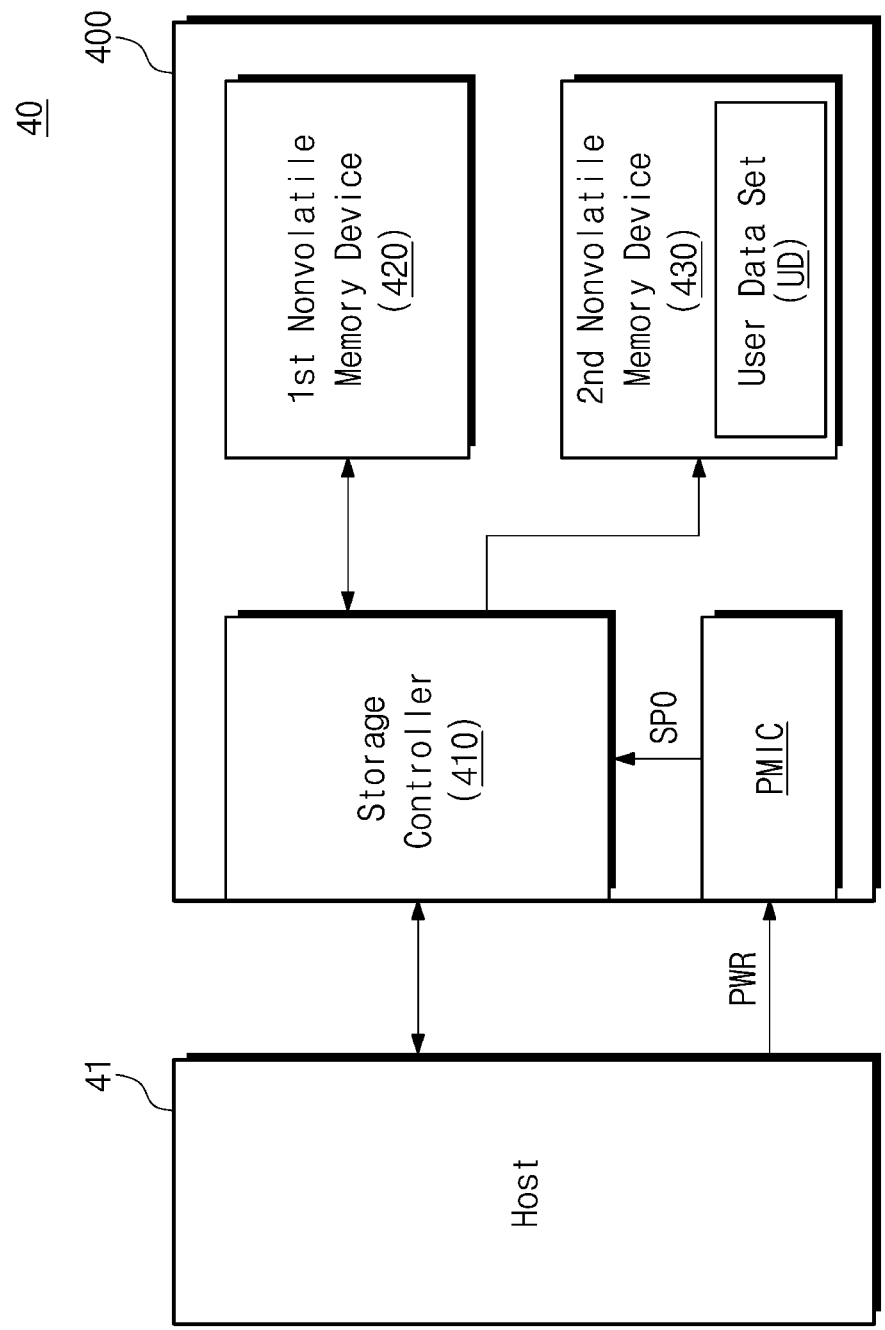
FIG. 12 is a block diagram illustrating a storage system according to some example embodiments of the inventive concepts.

FIG. 12 is a block diagram illustrating a storage system according to some example embodiments of the inventive concepts. Referring to FIG. 12, a storage system 40 may include a host 41 and/or a storage device 400. The storage device 400 may include a storage controller 410, a first nonvolatile memory device 420, a second nonvolatile memory device 430, and/or a power management integrated circuit PMIC. The host 41, the storage controller 400, the first nonvolatile memory device 420, and the power management integrated circuit PMIC are described above, and thus, additional description will be omitted to avoid redundancy.

The second nonvolatile memory device 430 of FIG. 12 may be used as a data buffer of the storage device 400. For example, user data UD received from the host 41 may be stored to the second nonvolatile memory device 430, and the user data UD stored in the second nonvolatile memory device 430 may be selectively moved (or copied) to the first nonvolatile memory device 420. Alternatively, the second nonvolatile memory device 430 may be configured to store user data UD read from the first nonvolatile memory device 420 and to provide the stored user data UD to the host 41.

In response to the SPO signal from the power management integrated circuit PMIC, the storage controller 410 may suspend an operation of the first nonvolatile memory device 420 and may write a SPO flag associated with user data UD to be provided to the first nonvolatile memory device 420 from the second nonvolatile memory device 430. In some example embodiments, the user data UD to be provided to the first nonvolatile memory device 420 may indicate user data not stored in the first nonvolatile memory device 420 or user data corresponding to a program operation suspended in the first nonvolatile memory device 420.

In the case where the storage device 400 is powered up after sudden power-off, the storage controller 410 may perform migration of the user data UD from the second nonvolatile memory device 430 to the first nonvolatile memory device 420, based on the user data UD and the SPO flag stored in the second nonvolatile memory device 430.

As described above, when the sudden power-off occurs, the storage device 400 may suspend an operation of the first nonvolatile memory device 420 and may write a SPO flag associated with the user data UD to be stored to the first nonvolatile memory device 420 into the second nonvolatile memory device 430. That is, when the sudden power-off occurs, once the storage device 400 writes a SPO flag into the second nonvolatile memory device 430 without completing an operation of the first nonvolatile memory device 420, the storage device 400 may cope with the sudden power-off situation by using a reduced auxiliary power source.

Figure 13:
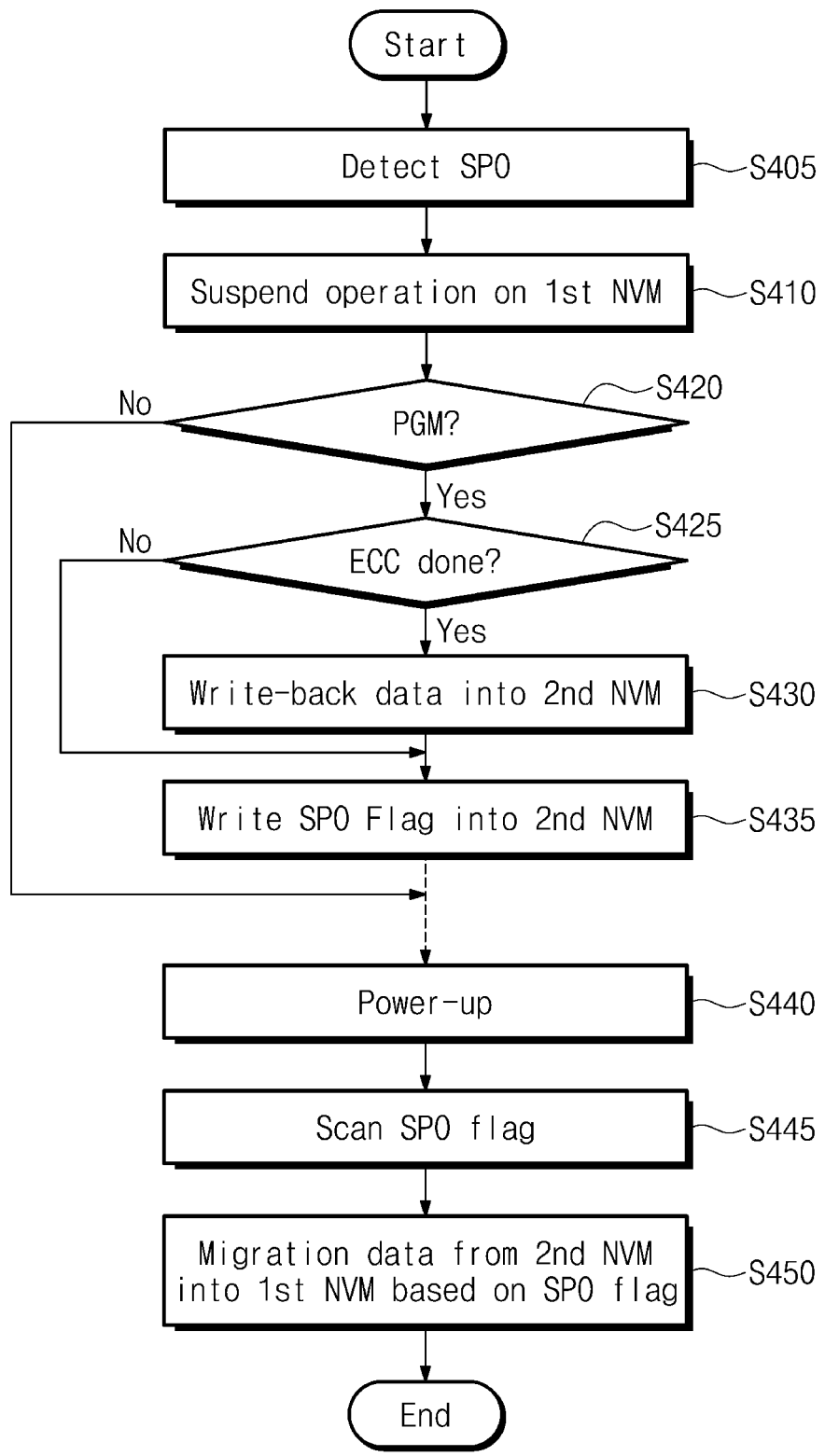
FIG. 13 is a flowchart illustrating an operation of a storage device of FIG. 12.
Figure 14B:
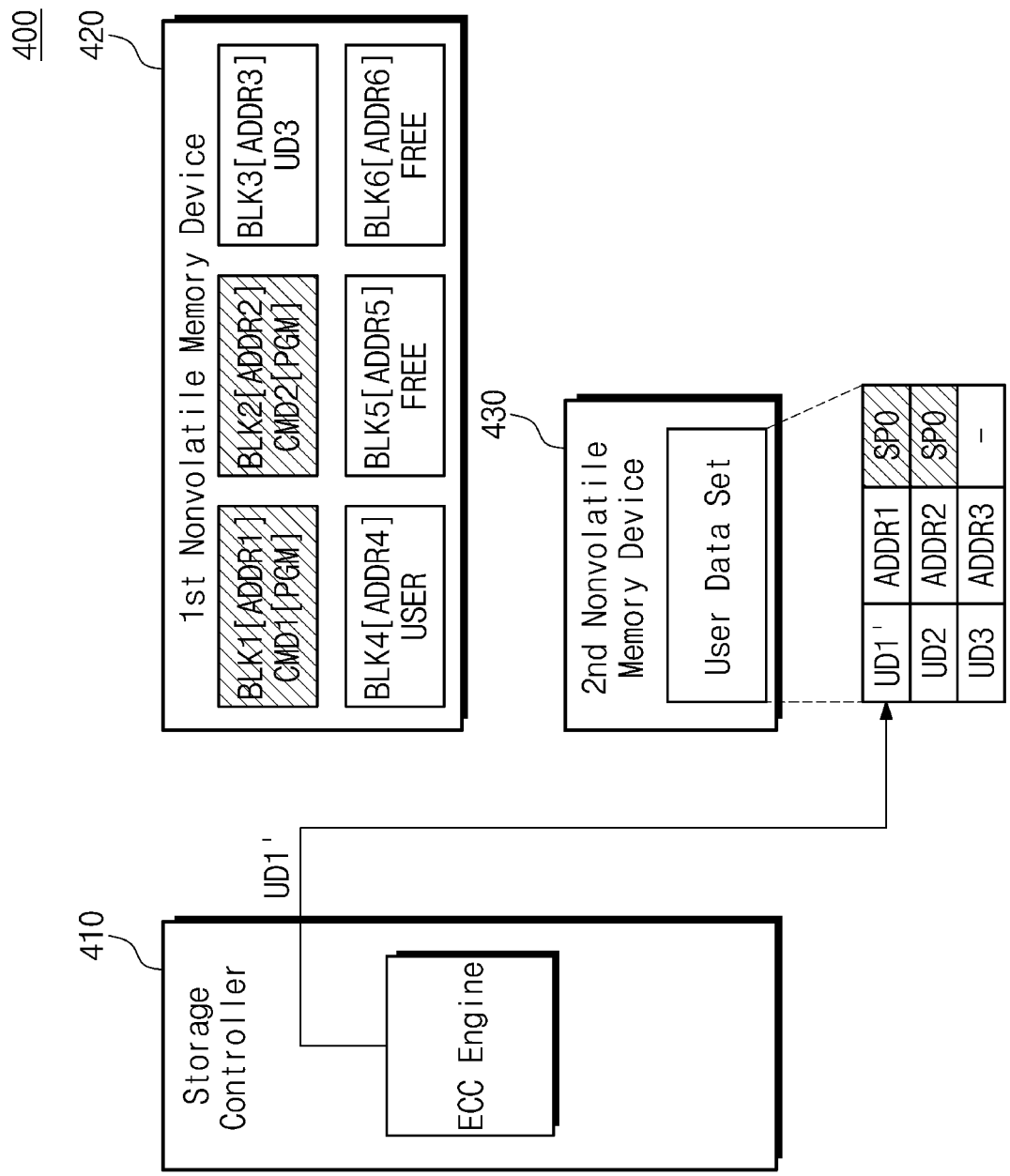
Figure 14C:
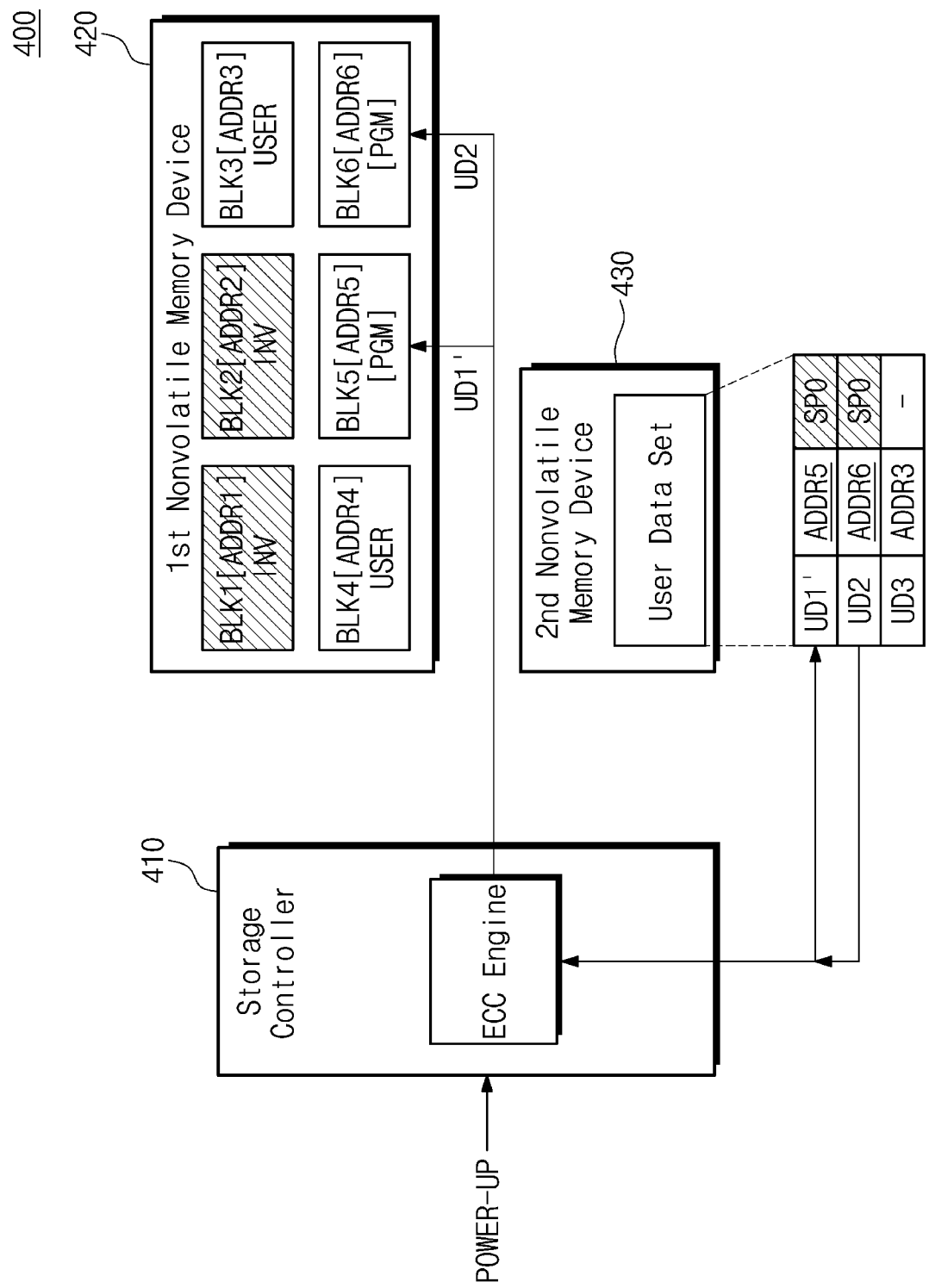

FIG. 13 is a flowchart illustrating an operation of a storage device of FIG. 12. FIGS. 14A to 14C are diagrams for describing an operation according to the flowchart of FIG. 13. Referring to FIGS. 12, 13, and 14A to 14C, the storage device 400 may perform operation S405 and operation S410. Operation S405 and operation S410 are similar to operation S110 and operation S120 of FIG. 4, and thus, additional description will be omitted to avoid redundancy.

In operation S420, the storage device 400 may determine whether an operation suspended in the first nonvolatile memory device 420 is the program operation PGM. For example, as illustrated in FIG. 14A, the second nonvolatile memory device 430 may store first, second, and third addresses ADDR1, ADDR2, and ADDR3 respectively corresponding to first, second, and third user data UD1, UD2, and UD3. The storage controller 410 may read the first to third user data UD1 to UD3 from the second nonvolatile memory device 430 and may program the read first to third user data UD1 to UD3 into the first to third memory blocks BLK1 to BLK3 corresponding to the first to third addresses ADDR1 to ADDR3, respectively. Embodiments of the storage device 400 illustrated in FIG. 14A show the case where the third user data UD3 are completely programmed into the third memory block BLK3 and the first and second user data UD1 and UD2 are being programmed into the first and second memory blocks BLK1 and BLK2.

In some example embodiments, an ECC engine 413 of the storage controller 410 may correct an error of user data read from the second nonvolatile memory device 430, and the error-corrected user data may be programmed into the first nonvolatile memory device 420.

In embodiments of the storage device 400 illustrated in FIG. 14A, in the case where sudden power-off occurs, the storage controller 410 may determine whether an operation suspended in the first nonvolatile memory device 420 is a program operation.

In the case where the suspended operation is the program operation, in operation S425, the storage device 400 may determine whether an ECC operation is completely performed on data to be programmed into the first nonvolatile memory device 420. For example, as illustrated in FIG. 14A, the storage controller 410 may read the first user data UD1 from the second nonvolatile memory device 430, may perform an ECC operation on the read first user data UD1, and may provide error-corrected first user data UD1' to the first nonvolatile memory device 420. The first nonvolatile memory device 420 may program the error-corrected first user data UD1' into the first memory block BLK1. At this time, sudden power-off may occur.

That is, when the sudden power-off occurs while the error-corrected first user data UD1' is being programmed into the first nonvolatile memory device 420 after the ECC operation is completely performed on the first user data UD1 (in other words, in the case where a result of operation S425 corresponds to "Yes"), in operation S430, the storage device 400 may rewrite the user data being programmed into the second nonvolatile memory device 430.

For example, as illustrated in FIG. 14B, the storage device 400 may write the error-corrected first user data UD1' into the second nonvolatile memory device 430. In some example embodiments, the storage controller 410 may rewrite the error-corrected first user data UD1' into an area of the second nonvolatile memory device 430, in which the first user data UD1 are stored, or into a separate area. That is, as the error-corrected first user data UD1' is rewritten into the second nonvolatile memory device 430, the reliability of the first user data UD1 may be improved.

When the result of operation S425 corresponds "No", the storage device 400 may not perform a separate data write operation. For example, as illustrated in FIGS. 14A and 14B, at a time point when the sudden power-off occurs, the storage controller 410 may be in a state where the ECC operation is not completely performed on the second user data UD2 (e.g., in a state where the second user data UD2 is being read from the second nonvolatile memory device 430). In this case, since the second user data UD2 is stored in the second nonvolatile memory device 430, a separate rewrite operation may not be performed.

Afterwards, in operation S435, the storage device 400 may write a SPO flag into the second nonvolatile memory device 430. For example, as illustrated in FIG. 14B, the storage controller 410 may write a SPO flag associated with user data UD1 and UD2 corresponding to a program operation suspended in the first nonvolatile memory device 420.

In operation S440, the storage device 400 may be powered up.

In operation S445, the storage device 400 may scan a SPO flag from the second nonvolatile memory device 430. For example, in an initialization operation according to the power-up, the storage device 400 may read the SPO flag stored in the second nonvolatile memory device 430. The storage device 400 may recognize user data (e.g., UD1' and UD2) not stored in the first nonvolatile memory device 420 based on the SPO flag read from the second nonvolatile memory device 430.

In operation S450, based on the scanned SPO flag, the storage device 400 may perform migration of user data from the second nonvolatile memory device 430 to the first nonvolatile memory device 420. For example, as illustrated in FIG. 14C, the second nonvolatile memory device 430 may include SPO flags associated with the first user data UD1' and the second user data UD2. The storage controller 410 may read the first user data UD1' and the second user data UD2, in which the SPO flags are respectively written, and may perform an error correction operation (performed by the ECC engine 413) on the first user data UD1' and the second user data UD2. The first and second user data UD1' and UD2' error-corrected may be written into the fifth and sixth memory blocks BLK5 and BLK6, respectively.

In some example embodiments, the first and second user data UD1 and UD2 may be user data to be written into the first and second memory blocks BLK1 and BLK2 before sudden power-off; however, as a program operation of the first and second memory blocks BLK1 and BLK2 is suspended due to the sudden power-off, the first and second memory blocks BLK1 and BLK2 may be processed to be invalid. The invalid block processing operation is described above, and thus, additional description will be omitted to avoid redundancy. As such, the storage controller 410 may program the first and second user data UD1' and UD2' into any other memory blocks (e.g., BLK5 and BLK6) instead of the first and second memory blocks BLK1 and BLK2 set to an invalid block. In some example embodiments, as the first and second user data UD1' and UD2' are programmed into any other memory blocks (e.g., BLK5 and BLK6), mapping information about the first and second user data UD1' and UD2' may be updated. In some example embodiments, the mapping information may be managed by the storage controller 410 or may be stored into the second nonvolatile memory device 430 together with the first and second user data UD1' and UD2.

As described above, in the case where the second nonvolatile memory device 430 is used as a data buffer of the storage device 400, when sudden power-off occurs, the storage device 400 may suspend an operation of the first nonvolatile memory device 420 and may write a SPO flag associated with user data not stored in the first nonvolatile memory device 420 among user data stored in the second nonvolatile memory device 430. Afterwards, in the case where the storage device 400 is powered up, the storage device 400 may scan a SPO flag of the second nonvolatile memory device 430, and may perform migration or copy of user data from the second nonvolatile memory device 430 to the first nonvolatile memory device 420.

Figure 15:
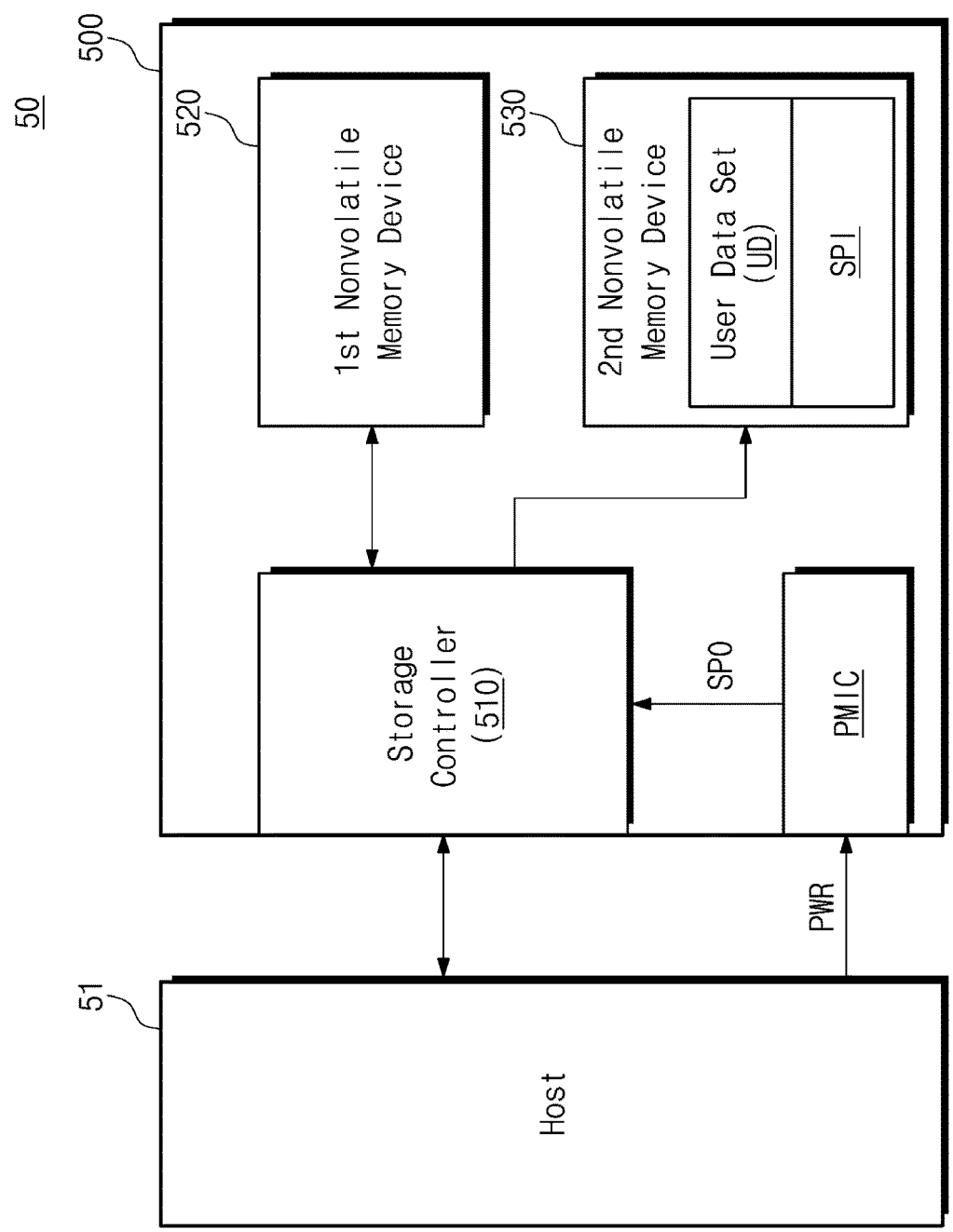
FIG. 15 is a block diagram illustrating a storage system according to some example embodiments of the inventive concepts.

FIG. 15 is a block diagram illustrating a storage system according to some example embodiments of the inventive concepts. Referring to FIG. 15, a storage system 50 may include a host 51 and/or a storage device 500. The storage device 500 may include a storage controller 510, a first nonvolatile memory device 520, a second nonvolatile memory device 530, and/or a power management integrated circuit PMIC. The host 51, the storage device 500, the storage controller 510, the first nonvolatile memory device 520, and the power management integrated circuit PMIC are described above, and thus, additional description will be omitted to avoid redundancy.

As in the description given with reference to FIGS. 12 to 14C, the second nonvolatile memory device 530 of FIG. 15 may be used as a data buffer of the storage device 500. That is, the second nonvolatile memory device 530 may be configured to store user data UD to be programmed into the first nonvolatile memory device 520 or user data UD read from the first nonvolatile memory device 520. In addition, as described with reference to FIGS. 1 to 11, the second nonvolatile memory device 530 of FIG. 15 may be configured to store suspension information SPI or operation information about the first nonvolatile memory device 520. That is, the second nonvolatile memory device 530 may be used as a data buffer and a management buffer of the storage device 500.

In this case, as described with reference to FIGS. 1 to 11, in sudden power-off, the storage device 500 may suspend an operation being performed in the first nonvolatile memory device 520 and may write information about the suspended operation into the second nonvolatile memory device 530 as suspension information. Also, as described with reference to FIGS. 12 to 14C, the storage device 500 may write a SPO flag in user data corresponding to the suspended program operation.

Figure 16:
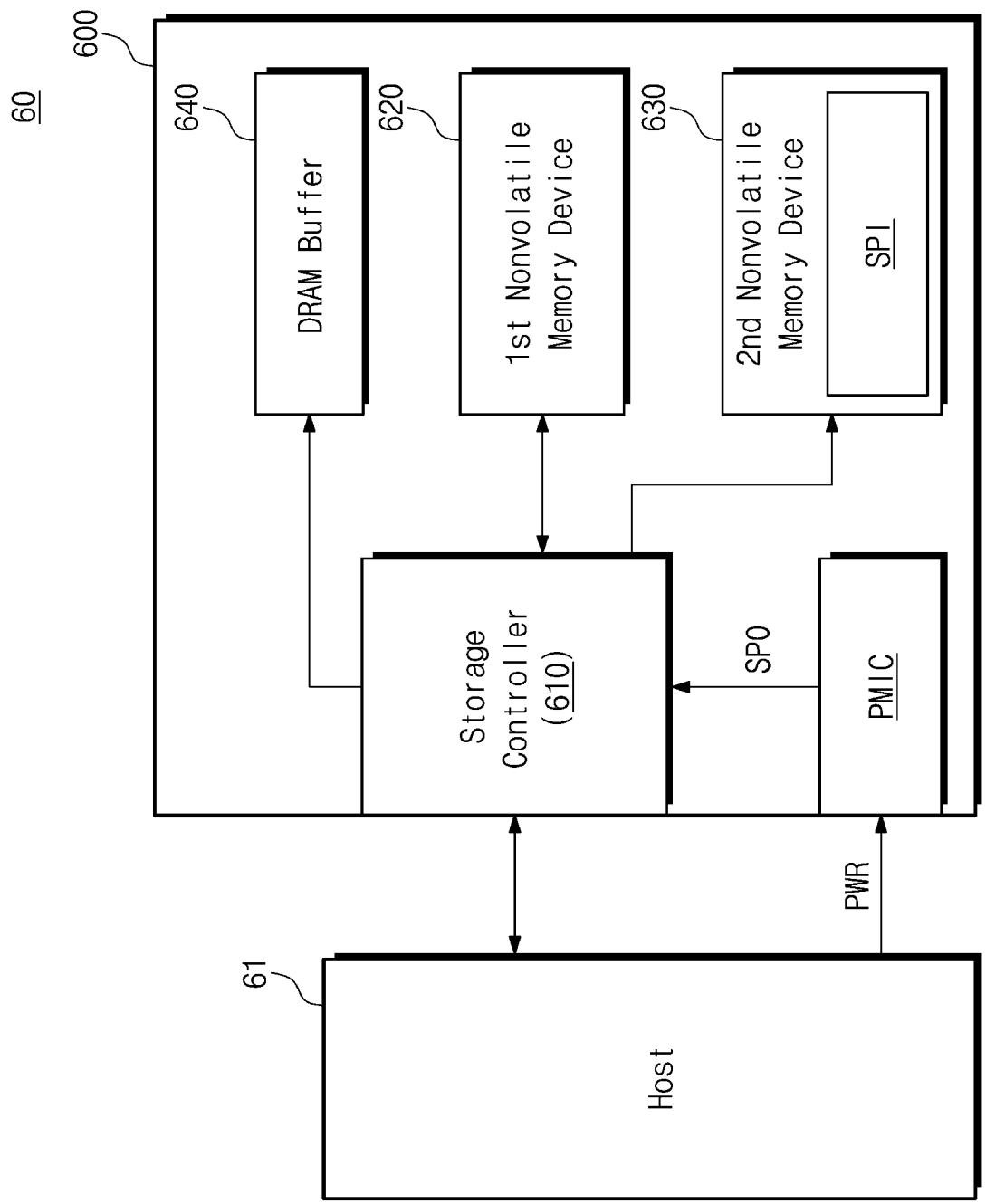
FIG. 16 is a block diagram illustrating a storage system according to some example embodiments of the inventive concepts.

FIG. 16 is a block diagram illustrating a storage system according to some example embodiments of the inventive concepts. Referring to FIG. 16, a storage system 60 may include a host 61 and/or a storage device 600. The storage device 600 may include a storage controller 610, a first nonvolatile memory device 620, a second nonvolatile memory device 630, a power management integrated circuit PMIC, and/or a DRAM buffer 640. The host 61, the storage device 600, the storage controller 610, the first nonvolatile memory device 620, the second nonvolatile memory device 630, and the power management integrated circuit PMIC are described above, and thus, additional description will be omitted to avoid redundancy.

The storage device 600 of FIG. 16 may include the DRAM buffer 640. The DRAM buffer 640 may be used as a data buffer of the storage device 600. That is, the DRAM buffer 640 may be configured to temporarily store user data received from the host 61 or user data read from the first nonvolatile memory device 620. Alternatively, the DRAM buffer 640 may be configured to store various meta information (e.g., a mapping table and an FTL) necessary for the storage device 600 to operate.

In some example embodiments, in the case where sudden power-off occurs, based on the method described with reference to FIGS. 1 to 11, the storage controller 610 may suspend an operation being performed in the first nonvolatile memory device 620 and may write the suspension information SPI about the suspended operation into the second nonvolatile memory device 630. In this case, the storage controller 610 may write user data or meta information stored in the DRAM buffer 640 into the second nonvolatile memory device 630.

After the sudden power-off, in the case where the storage device 600 is powered up, the storage device 600 may perform a block management operation based on information stored in the second nonvolatile memory device 630, through the methods described with reference to FIGS. 1 to 15.

Figure 17:
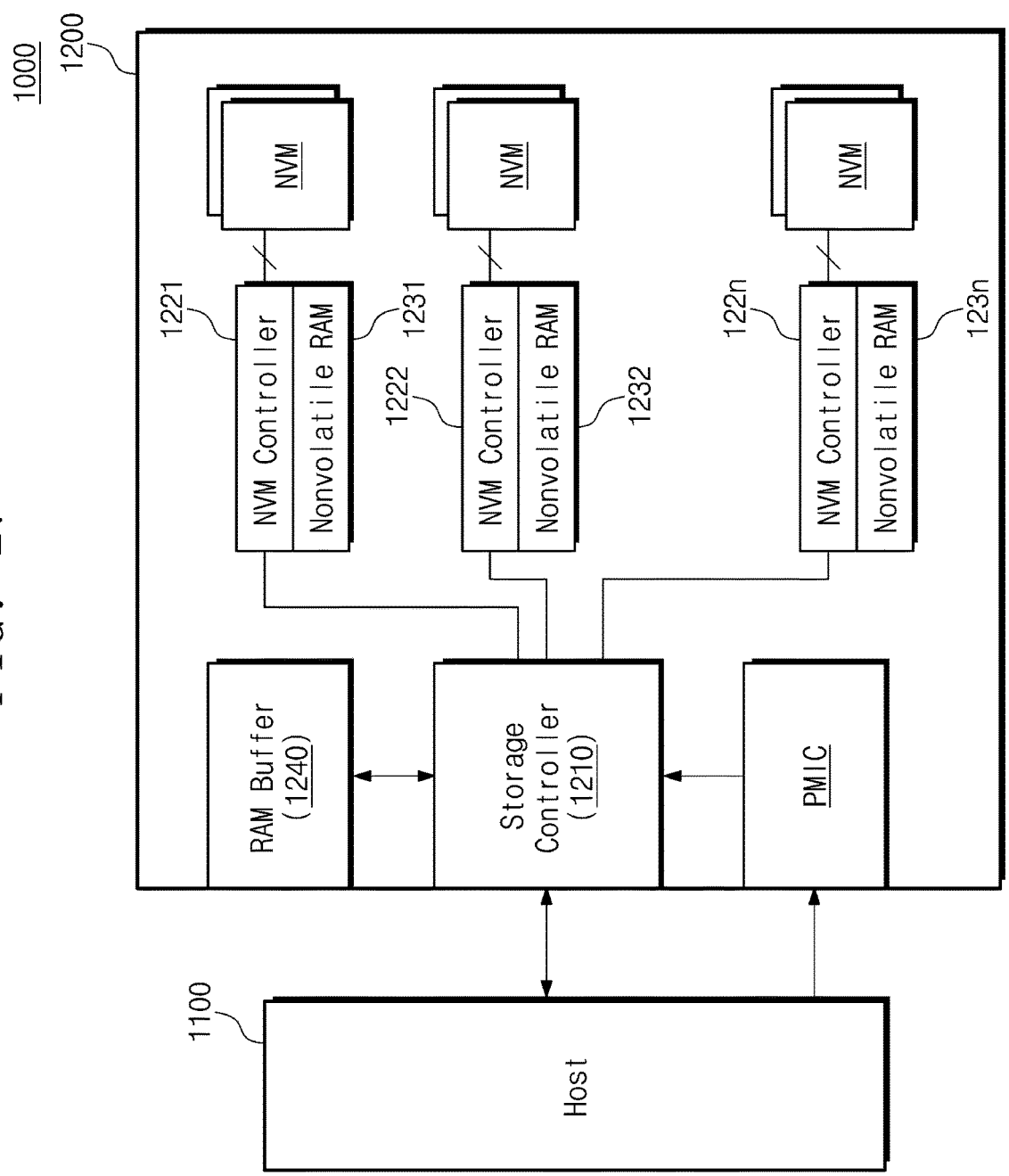
FIG. 17 is a block diagram illustrating a storage system according to some example embodiments of the inventive concepts.

FIG. 17 is a block diagram illustrating a storage system according to some example embodiments of the inventive concepts. Referring to FIG. 17, a storage system 1000 may include a host 1100 and a storage device 1200. The storage device 1200 may include a storage controller 1210, a plurality of nonvolatile memory devices NVM, a plurality of nonvolatile memory controllers 1221 to 122n, a plurality of nonvolatile RAMs 1231 to 123n, a power management integrated circuit PMIC, and/or a RAM buffer 1240.

The storage controller 1210 may be configured to control overall operations of the storage device 1200 under control of the host 1100. The plurality of nonvolatile memory controllers (hereinafter referred to as "NVM controllers") 1221 to 122n may be configured to control the plurality of nonvolatile memories NVM and the plurality of nonvolatile RAMs 1231 to 123n, respectively. In some example embodiments, the storage controller 1210 may communicate with the plurality of NVM controllers 1221 and 122n through a plurality of channels.

In some example embodiments, the NVM controllers 1221 to 122n may control the plurality of nonvolatile memory devices NVM and the plurality of nonvolatile RAMs 1231 to 123n based on the operating method described with reference to FIGS. 1 to 16. For example, when sudden power-off occurs, the NVM controllers 1221 to 122n may suspend operations of the plurality of nonvolatile memory devices NVM and may write suspension information or SPO flags into the plurality of nonvolatile RAMs 1231 to 123n. In power-up, the NVM controllers 1221 to 122n may perform a block management operation or a data migration operation based on the suspension information or the SPO flags from the plurality of nonvolatile RAMs 1231 to 123n.

The RAM buffer 1240 may be configured to store a variety of information necessary for the storage device 1200 to operate. Alternatively, the RAM buffer 1240 may be used as a data buffer of the storage device 1200.

The power management integrated circuit PMIC may provide various voltages necessary for the storage device 1200 to operate, based on a power from the host 1100. The power management integrated circuit PMIC may detect the sudden power-off which occurs at the storage device 1200.

According to the inventive concepts, in the case where sudden power-off occurs, a storage device may suspend an operation being performed in a first nonvolatile memory device and may write information about the suspended operation into a second nonvolatile memory device. In this case, since power consumption upon writing the information about the suspended operation into the second nonvolatile memory device is smaller than power consumption upon completing the operation of the first nonvolatile memory device, the storage device may cope with the sudden power-off by using an auxiliary power source of a reduced capacity. Accordingly, a storage device with reduced costs and/or a reduced area and an operating method thereof are provided.

While the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. An operating method of a storage device which includes a first nonvolatile memory device, a second nonvolatile memory device, and a storage controller configured to control the first nonvolatile memory device and the second nonvolatile memory device, the method comprising:

detecting sudden power-off;

suspending an operation being performed in the first nonvolatile memory device, in response to the detected sudden power-off;

writing suspension information about the suspended operation into the second nonvolatile memory device; and performing a block management operation on the first nonvolatile memory device based on the suspension information written into the second nonvolatile memory device, in power-up after the sudden power-off, wherein the storage device further includes a power management circuit configured to supply a power to the first nonvolatile memory device, the second nonvolatile memory device, and the storage controller, to detect sudden power-off associated with at least one of the first nonvolatile memory device, the second nonvolatile memory device, and the storage controller, and to provide a sudden power-off signal to the storage controller.

2. The method of claim 1, wherein the suspension information includes a suspended command and a suspended address corresponding to the suspended operation.

3. The method of claim 2, wherein the block management operation includes a remapping operation and a garbage collection (GC) priority adjusting operation, wherein, when the suspended command is a program command, the remapping operation is performed on a memory block corresponding to the suspended address, and wherein, when the suspended command is an erase command, the GC priority adjusting operation is performed on the memory block corresponding to the suspended address.

4. The method of claim 3, wherein the remapping operation includes processing the memory block corresponding to the suspended address as an invalid block, performing migration of data stored in the memory block to another memory block, and mapping a logical address corresponding to the migrated data onto a physical address of the another memory block.

5. The method of claim 3, wherein the GC priority adjusting operation includes increasing a GC priority of the memory block corresponding to the suspended address, the method further comprising:
performing a garbage collection operation on the first nonvolatile memory device based on the GC priority.

6. The method of claim 5, wherein the GC priority of the memory block is further adjusted based on a program and erase cycle of the memory block.

7. The method of claim 2, further comprising:
performing an erase operation on the first nonvolatile memory device,
wherein, when a memory block targeted for the erase operation corresponds to the suspended address, the memory block is erased in a manner where a verification operation is performed before the erase operation, and
wherein, when the memory block targeted for the erase operation does not correspond to the suspended address, the memory block is erased based on a normal erase manner.

8. The method of claim 1, wherein the sudden power-off is sudden power-off associated with the first nonvolatile memory device.

9. The method of claim 1, wherein an operating speed of the second nonvolatile memory device is faster than an operating speed of the first nonvolatile memory device.

10. The method of claim 1, wherein the first nonvolatile memory device is a NAND flash memory device, and the second nonvolatile memory device is a magnetic random access memory (MRAM).

11. A storage device comprising:
a first nonvolatile memory device configured to store user data;
a second nonvolatile memory device configured to store operation information about an operation of the first nonvolatile memory device;
a storage controller configured to suspend the operation being performed in the first nonvolatile memory device when sudden power-off occurs, to write a sudden power-off flag in operation information corresponding to the suspended operation among the operation information stored in the second nonvolatile memory device, and to perform a block management operation on the first nonvolatile memory device based on the sudden power-off flag written into the second nonvolatile memory device, in power-up after the sudden power-off; and
a power management circuit configured to supply a power to the first nonvolatile memory device, the second nonvolatile memory device, and the storage controller, to detect sudden power-off associated with at least one of the first nonvolatile memory device, the second nonvolatile memory device, and the storage controller, and to provide a sudden power-off signal to the storage controller.

12. The storage device of claim 11, wherein the operation information includes an operating command and an operating address associated with the operation of the first nonvolatile memory device.

13. The storage device of claim 12, wherein the block management operation includes a remapping operation and a garbage collection (GC) priority adjusting operation,
wherein, when the operating command corresponding to the sudden power-off flag is a program command, the remapping operation is performed on a memory block corresponding to a suspended address among a plurality of memory blocks of the first nonvolatile memory device, and
wherein, when the operating command is an erase command, the GC priority adjusting operation is performed on the memory block corresponding to the suspended address.

14. The storage device of claim 13, wherein the remapping operation includes processing the memory block corresponding to the operating address as an invalid block, performing migration of data stored in the memory block to another memory block, and mapping a logical address corresponding to the migration data onto a physical address of the another memory block.

15. The storage device of claim 13, wherein the GC priority adjusting operation includes increasing a GC priority of the memory block corresponding to the operating address, and
wherein the storage controller is further configured to perform a garbage collection operation on the first nonvolatile memory device based on the GC priority.

16. The storage device of claim 11, wherein an operating speed of the second nonvolatile memory device is faster than an operating speed of the first nonvolatile memory device.

* * * * *